United States Patent
Yamada

(10) Patent No.: US 12,527,221 B2
(45) Date of Patent: Jan. 13, 2026

(54) OSCILLATOR MANUFACTURING METHOD

(71) Applicant: SEIKO EPSON CORPORATION, Tokyo (JP)

(72) Inventor: Yohei Yamada, Chino (JP)

(73) Assignee: SEIKO EPSON CORPORATION, Tokyo (JP)

(*) Notice: Subject to any disclaimer, the term of this patent is extended or adjusted under 35 U.S.C. 154(b) by 352 days.

(21) Appl. No.: 18/299,613

(22) Filed: Apr. 12, 2023

(65) Prior Publication Data

US 2023/0337542 A1  Oct. 19, 2023

(30) Foreign Application Priority Data

Apr. 14, 2022 (JP) ................... 2022-066783

(51) Int. Cl.
  *H10N 30/03* (2023.01)
  *H03B 5/32* (2006.01)

(52) U.S. Cl.
  CPC ............ *H10N 30/03* (2023.02); *H03B 5/32* (2013.01)

(58) Field of Classification Search
  CPC . H10N 30/03; H03B 5/32; H03B 1/00; H03B 2200/0022; H01L 23/02
  See application file for complete search history.

(56) References Cited

U.S. PATENT DOCUMENTS

| | | | | |
|---|---|---|---|---|
| 6,081,164 A * | 6/2000 | Shigemori | ............ | H03L 7/183 331/25 |
| 7,123,107 B2 * | 10/2006 | Koyama | ............ | H03H 9/1021 361/813 |
| 7,583,157 B2 * | 9/2009 | Sakurai | ............ | H03L 7/183 331/66 |
| 2003/0001682 A1 * | 1/2003 | Biernacki | ............ | H03H 9/1014 331/68 |
| 2004/0178858 A1 * | 9/2004 | Miyazaki | ............ | H03H 9/1021 331/158 |

(Continued)

FOREIGN PATENT DOCUMENTS

| | | | | |
|---|---|---|---|---|
| CA | 2287095 A1 * | 4/2000 | ......... | H03H 9/0547 |
| CN | 106026915 A * | 10/2016 | ......... | H03B 5/04 |

(Continued)

OTHER PUBLICATIONS

Translation of CA-2287095-A1 (Year: 2000).*
Translation of CN-106026915-A (Year: 2016).*

*Primary Examiner* — Jeffrey T Carley
(74) *Attorney, Agent, or Firm* — Rankin, Hill & Clark LLP

(57) ABSTRACT

An oscillator manufacturing method is a method for manufacturing a plurality of types of oscillators including a first oscillator and a second oscillator. The method includes preparing a first resonator device and a second resonator device each including a resonator, an oscillation circuit electrically coupled to the resonator, and a storage circuit that stores characteristic setting information used to set the characteristics of the oscillation circuit, housing the first resonator device in a first container to manufacture the first oscillator, housing the second resonator device in a second container different in type from the first container to manufacture the second oscillator, and setting characteristic setting information in the storage circuit, and the first resonator device and the second resonator device are resonator devices of the same type.

9 Claims, 22 Drawing Sheets

(56) References Cited

U.S. PATENT DOCUMENTS

| | | | |
|---|---|---|---|
| 2008/0105951 A1 | 5/2008 | Sato et al. | |
| 2009/0236936 A1 | 9/2009 | Tamura | |
| 2014/0084474 A1 | 3/2014 | Suhr et al. | |
| 2018/0191303 A1 | 7/2018 | Kojo | |
| 2019/0149091 A1 | 5/2019 | Hosaka et al. | |
| 2019/0267941 A1* | 8/2019 | Obata | H03B 5/32 |
| 2020/0235701 A1* | 7/2020 | Nomura | H03L 7/23 |
| 2020/0274486 A1* | 8/2020 | Aoki | H03B 5/04 |
| 2020/0274488 A1* | 8/2020 | Aoki | H03H 9/02102 |
| 2020/0313070 A1* | 10/2020 | Yokoyama | H10N 30/88 |
| 2020/0373906 A1 | 11/2020 | Yoshioka | |
| 2022/0131519 A1 | 4/2022 | Ohnishi et al. | |
| 2023/0268885 A1* | 8/2023 | Matsukawa | H10N 30/87 |
| | | | 310/315 |

FOREIGN PATENT DOCUMENTS

| | | |
|---|---|---|
| JP | 2009-105411 A | 5/2009 |
| JP | 2009-232150 A | 10/2009 |
| JP | 2014-519201 A | 8/2014 |
| JP | 2019-87981 A | 6/2019 |
| JP | 2019-176339 A | 10/2019 |
| JP | 2020-36262 A | 3/2020 |
| JP | 2020-141264 A | 9/2020 |
| JP | 2021-44610 A | 3/2021 |
| WO | 2016/199645 A1 | 12/2016 |

\* cited by examiner

OSCILLATOR MANUFACTURING METHOD

The present application is based on, and claims priority from JP Application Serial Number 2022-066783, filed Apr. 14, 2022, the disclosure of which is hereby incorporated by reference herein in its entirety.

BACKGROUND

1. Technical Field

The present disclosure relates to an oscillator manufacturing method.

2. Related Art

JP-A-2009-232150 describes a quartz crystal oscillator in which a quartz crystal resonator element and an IC chip are housed in a ceramic package and the quartz crystal resonator element is fixed to a mounting base housed in the ceramic package and fixed thereto with an adhesive. According to the quartz crystal oscillator described in JP-A-2009-232150, a plurality of types of quartz crystal resonator elements and IC chips having different sizes can each be housed in a common package by changing the position where the mounting base is housed in the package and fixed thereto, the design flexibility of the sizes of the quartz crystal resonator element and the IC chip can be improved. The method described in JP-A-2009-232150 uses a common package, that is, a common container to manufacture a plurality of types of oscillators, and there is room for improvement to efficiently manufacture the plurality of oscillators housed in different types of containers and having different output characteristics, for example, the oscillation frequency, at a low cost.

SUMMARY

An oscillator manufacturing method is a method for manufacturing a plurality of types of oscillators including first oscillator and a second oscillator, the method a including preparing a first resonator device and a second resonator device each including resonator, a first substrate, a second substrate so disposed that the first and second substrates sandwich the resonator, an oscillation circuit electrically coupled to the resonator, and a storage circuit that stores characteristic setting information used to set characteristics of the oscillation circuit, the first and second substrates each being a semiconductor substrate, a quartz crystal substrate, a glass substrate, or a resin film substrate; housing the first resonator device in a first container to manufacture the first oscillator; housing the second resonator device in a second container different in type from the first container to manufacture the second oscillator; and setting the characteristic setting information in the storage circuit, and the first resonator device housed in the first container and the second resonator device housed in the second container are resonator devices of the same type.

DESCRIPTION OF EXEMPLARY EMBODIMENTS

Embodiments of the present disclosure will next be described with reference to the drawings.

For convenience of the description, FIGS. 2 to 5, 7, 8, 11, 14 to 16, 18, and 20 to 23 show axes X, Y, and Z as three axes perpendicular to one another. The direction along the axis X is called a "direction X", the direction along the axis Y is called a "direction Y", and the direction along the axis Z is called a "direction Z". The tip side of the arrow that accompanies each of the axes is also called a "positive side", and the base side of the arrow is also called a "negative side". For example, the direction Y refers to both the directions Y oriented toward the positive and negative sides. The positive side of the direction Z is also referred to as "upper", and the negative side of the direction Z as "lower". A plan view viewed in the direction Z is also simply called a "plan view".

Figure 3:
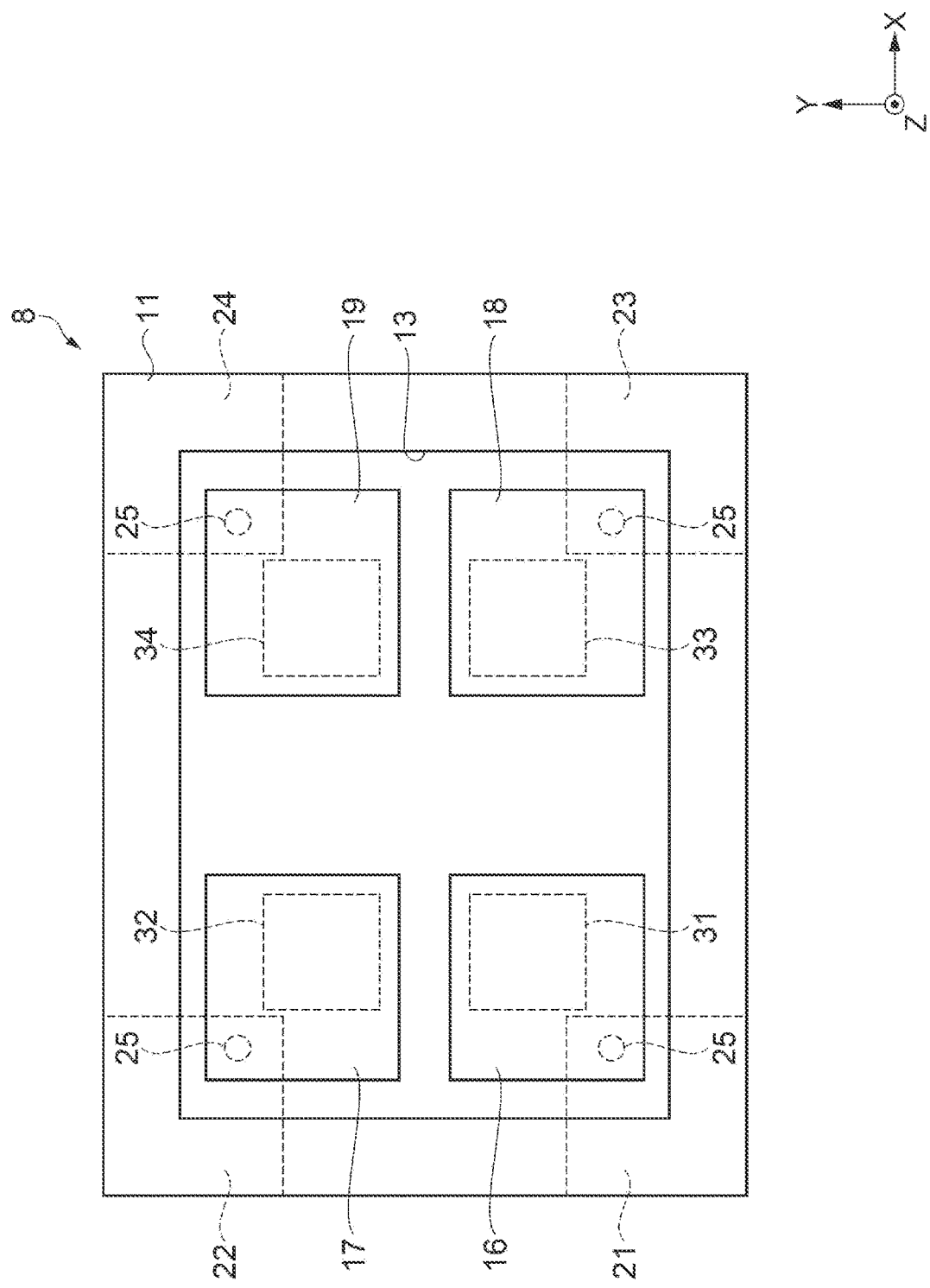
FIG. 3 is a plan view of a first container.
Figure 5:
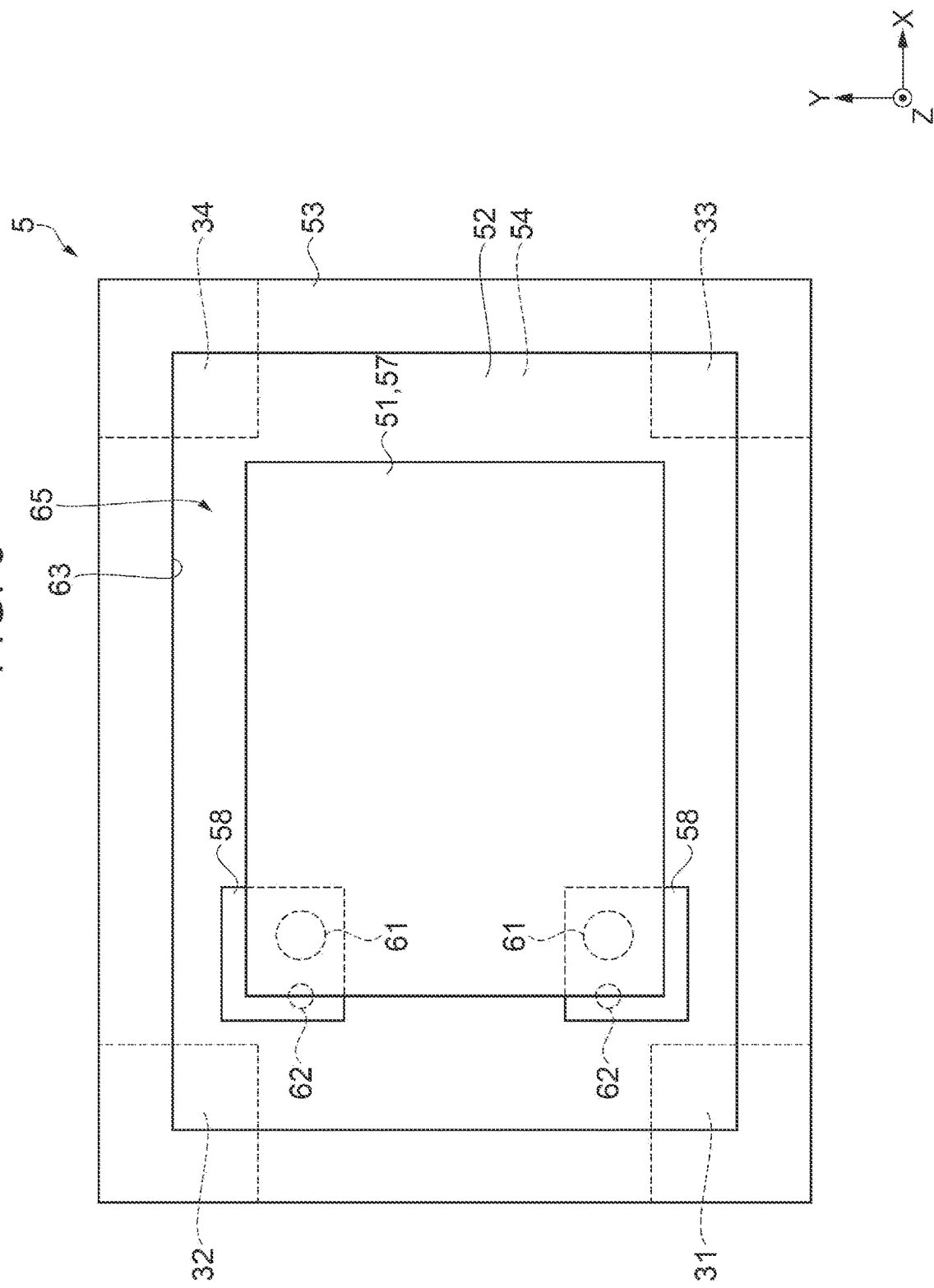
FIG. 5 is a plan view of the resonator device.
Figure 8:
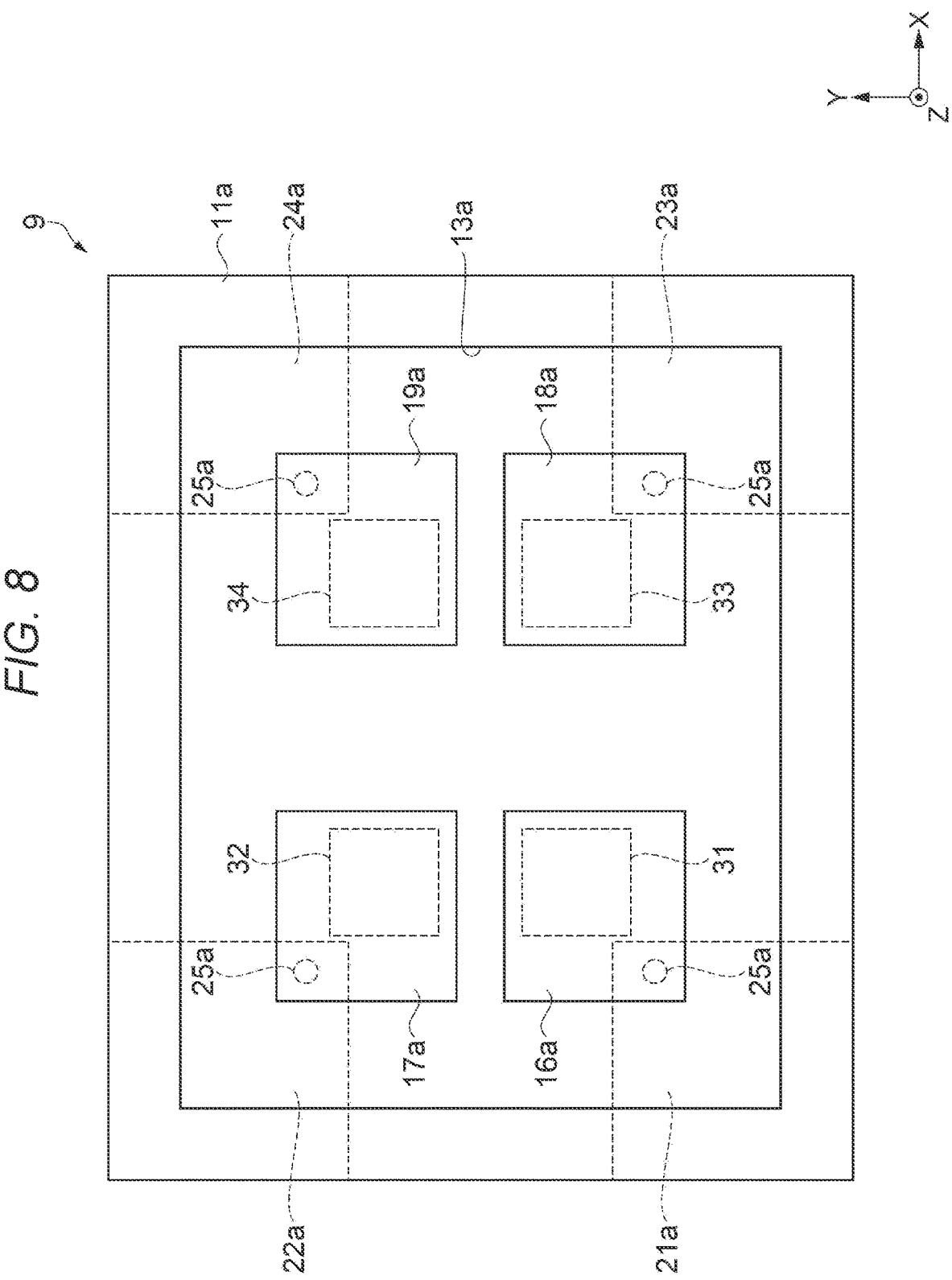
FIG. 8 is a plan view of a second container.
Figure 21:
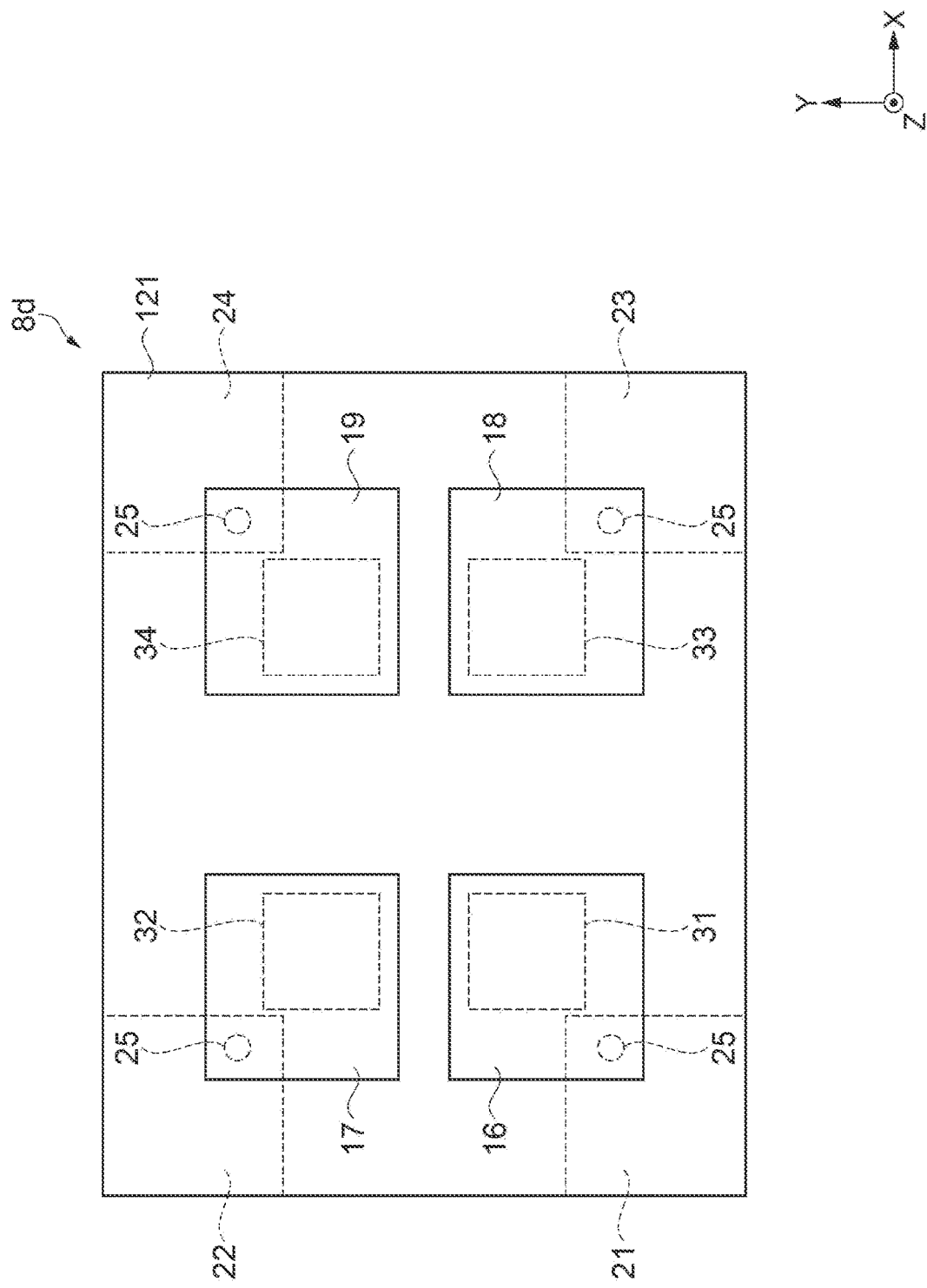
FIG. 21 is a plan view of the first container.
Figure 23:
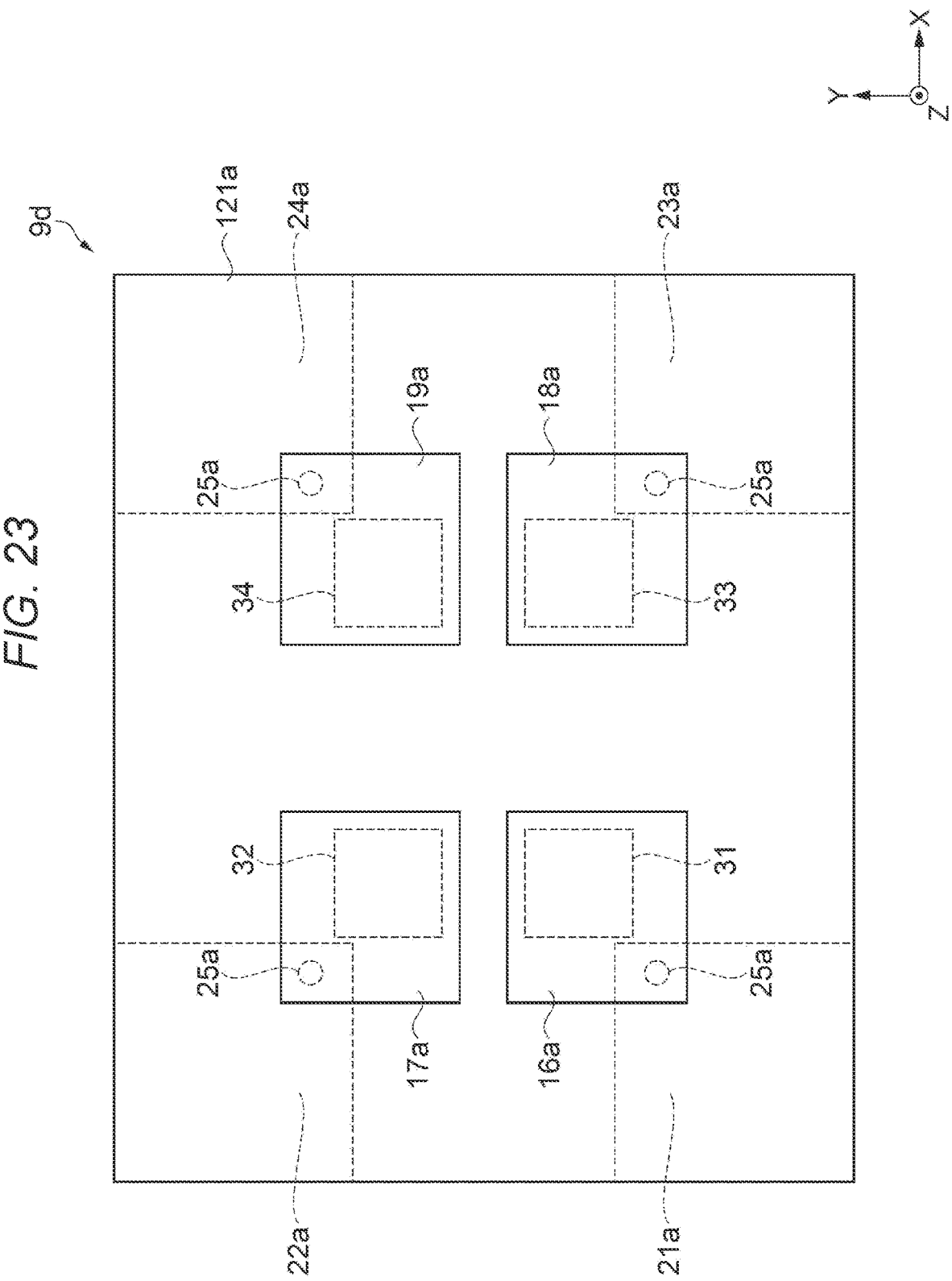
FIG. 23 is a plan view of the second container.

For convenience of the description, FIG. 3 shows a first container 8 with a lid 12 removed. FIG. 8 shows a second container 9 with a lid 12a removed. FIG. 21 shows a first container 8d with a molded section 122 removed. FIG. 23 shows a second container 9d with a molded section 122a removed. In FIGS. 3, 8, 21, and 23, connection electrodes 31, 32, 33, and 34 are drawn with broken lines. For convenience of the description, FIG. 5 shows a resonator device 5 through the upper surface of a second substrate 53.

1. First Embodiment

Figure 1:
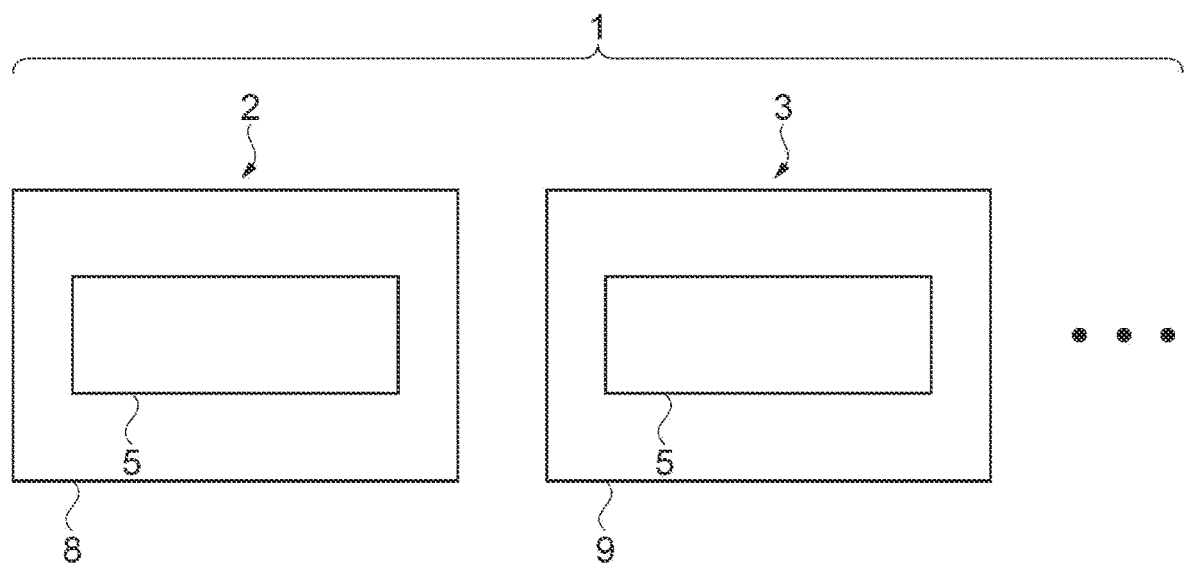
FIG. 1 shows the configuration of an oscillator group according to a first embodiment.

An oscillator group 1 according to a first embodiment will be described with reference to FIG. 1.

The oscillator group 1 is formed of a plurality of oscillators each including a resonator device housed in a container. The plurality of oscillators include a first oscillator 2 and a second oscillator 3.

The first oscillator 2 includes a resonator device 5 as a first resonator device and a first container 8, which houses the resonator device 5. The second oscillator 3 includes another resonator device 5 as a second resonator device and a second container 9, which houses the resonator device 5.

The resonator device 5 housed in the first container 8 and the resonator device 5 housed in the second container 9 are resonator devices of the same type. In detail, the resonator device 5 housed in the first container 8 and the resonator device 5 housed in the second container 9 have the same dimensions and shape, and connection electrodes of the resonator devices 5 have the same dimensions, shape, positions, number, and other factors when manufacturing errors are ignored. The connection electrodes of each of the resonator devices 5 are electrically coupled to inner electrodes of the corresponding one of the first container 8 and the second container 9. The connection electrodes of each of the resonator devices 5 and the inner electrodes of each of the first container 8 and the second container 9 will be described later.

The first container 8 and the second container 9 are containers of different types. In detail, the first container 8 and the second container 9 differ from each other, when manufacturing errors are ignored, in at least one of the following factors: the dimensions and shape of the containers themselves; and the dimensions, shape, position, number, and other factors of outer electrodes of each of the first container 8 and the second container 9. When a customer mounts the first oscillator 2 and the second oscillator 3 on a customer's substrate, the outer electrodes of the first container 8 and the second container 9 are electrically coupled to the customer's substrate. The outer electrodes of the first container 8 and the second container 9 are electrically coupled to the inner electrodes of the first container 8 and the second container 9, respectively. The outer electrodes of the first container 8 and the second container 9 will be described later.

As described above, the oscillator group 1 is formed of a plurality of types of oscillators including the first oscillator 2 and the second oscillator 3, which include the resonator devices 5 of the same type housed in the containers 8 and 9 of different types.

The first oscillator 2 will be described with reference to FIGS. 2 to 6.

Figure 2:
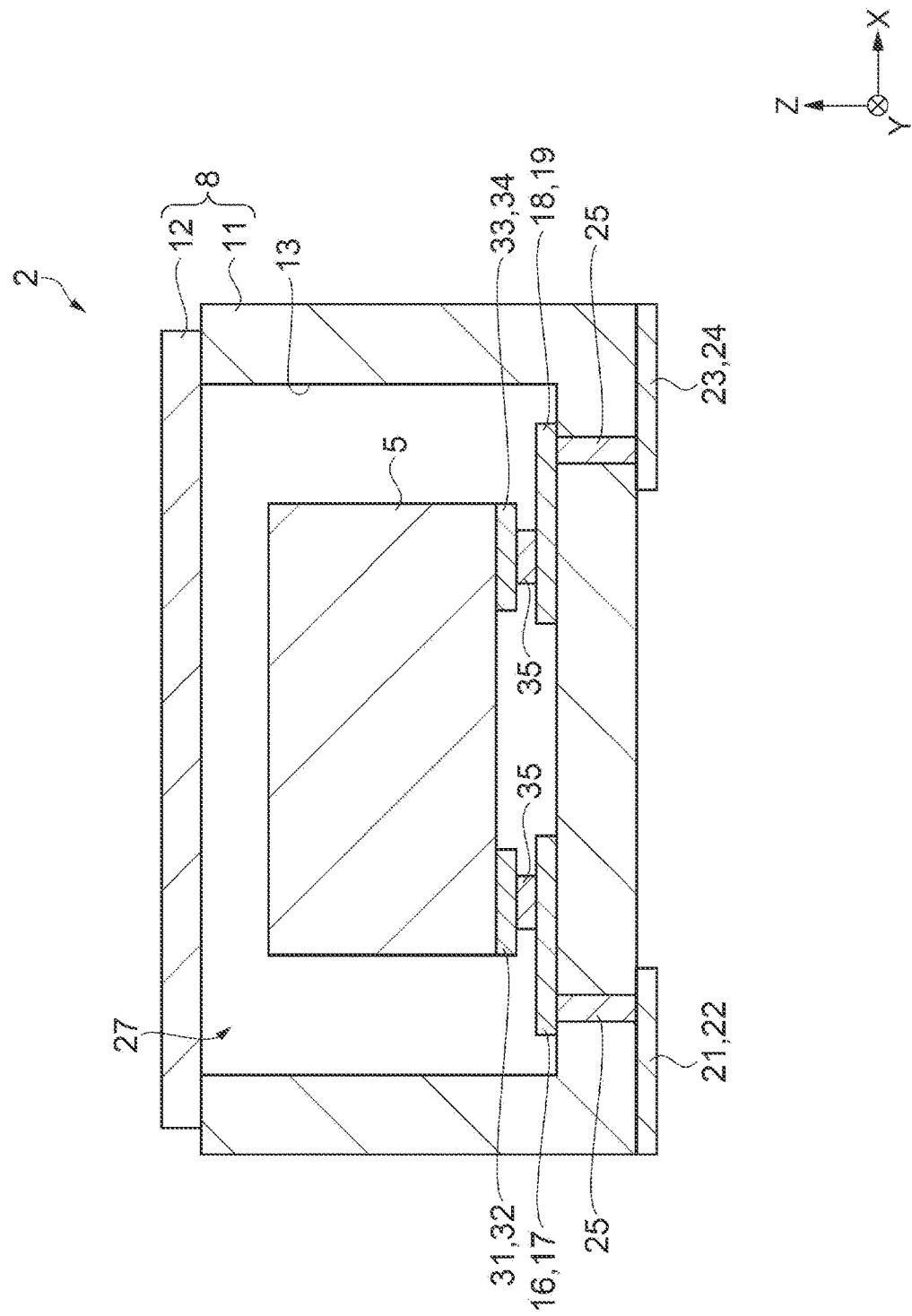
FIG. 2 is a cross-sectional view of a first oscillator according to the first embodiment.

The first oscillator 2 includes the resonator device 5 and the first container 8, which houses the resonator device 5, as shown in FIG. 2.

In the present embodiment, the first container 8 has a container body 11 and a lid 12.

The container body 11 is a box-shaped container body having a recess 13, as shown in FIGS. 2 and 3. The container body 11 has a rectangular shape in the plan view.

In the present embodiment, the container body 11 is a ceramic substrate. It is, however, noted that the container body 11 is not limited to a ceramic substrate and may instead, for example, be a semiconductor substrate or a printed circuit board.

The recess 13 has an opening at the upper surface of the container body 11. The recess 13 has a rectangular shape in the plan view.

A plurality of inner electrodes are disposed at the bottom surface of the recess 13. In detail, four inner electrodes 16, 17, 18, and 19 are disposed at the bottom surface of the recess 13.

A plurality of outer electrodes are disposed at the lower surface of the container body 11. In detail, four outer electrodes 21, 22, 23, and 24 are disposed at the lower surface of the container body 11.

The outer electrodes 21, 22, 23, and 24 and the inner electrodes 16, 17, 18, and 19 are electrically coupled to each other, respectively, via pass-through electrodes 25. The pass-through electrodes 25 are each an electrode that passes through the portion between the lower surface of the container body 11 and the bottom surface of the recess 13.

The lid 12 is a flat-plate-shaped lid. The lid 12 has a rectangular shape in the plan view.

In the present embodiment, the lid 12 is made of metal such as Kovar. It is, however, noted that the lid 12 is not necessarily made of metal and may instead, for example, be a glass or ceramic substrate.

The lower surface of the lid 12 is bonded to the upper surface of the container body 11 via a bonding member that is not shown. The lid 12 is bonded to the container body 11 to close the opening of the recess 13. A housing space 27, which houses the resonator device 5, is thus formed between the lid 12 and the container body 11. The housing space 27 is hermetically sealed by the lid 12 and the container body 11. The housing space 27 is depressurized. The depressurized housing space 27 allows reduction in heat conduction between the exterior of the first container 8 and the resonator device 5. It is, however, noted that the housing space 27 does not need to be depressurized.

Figure 4:
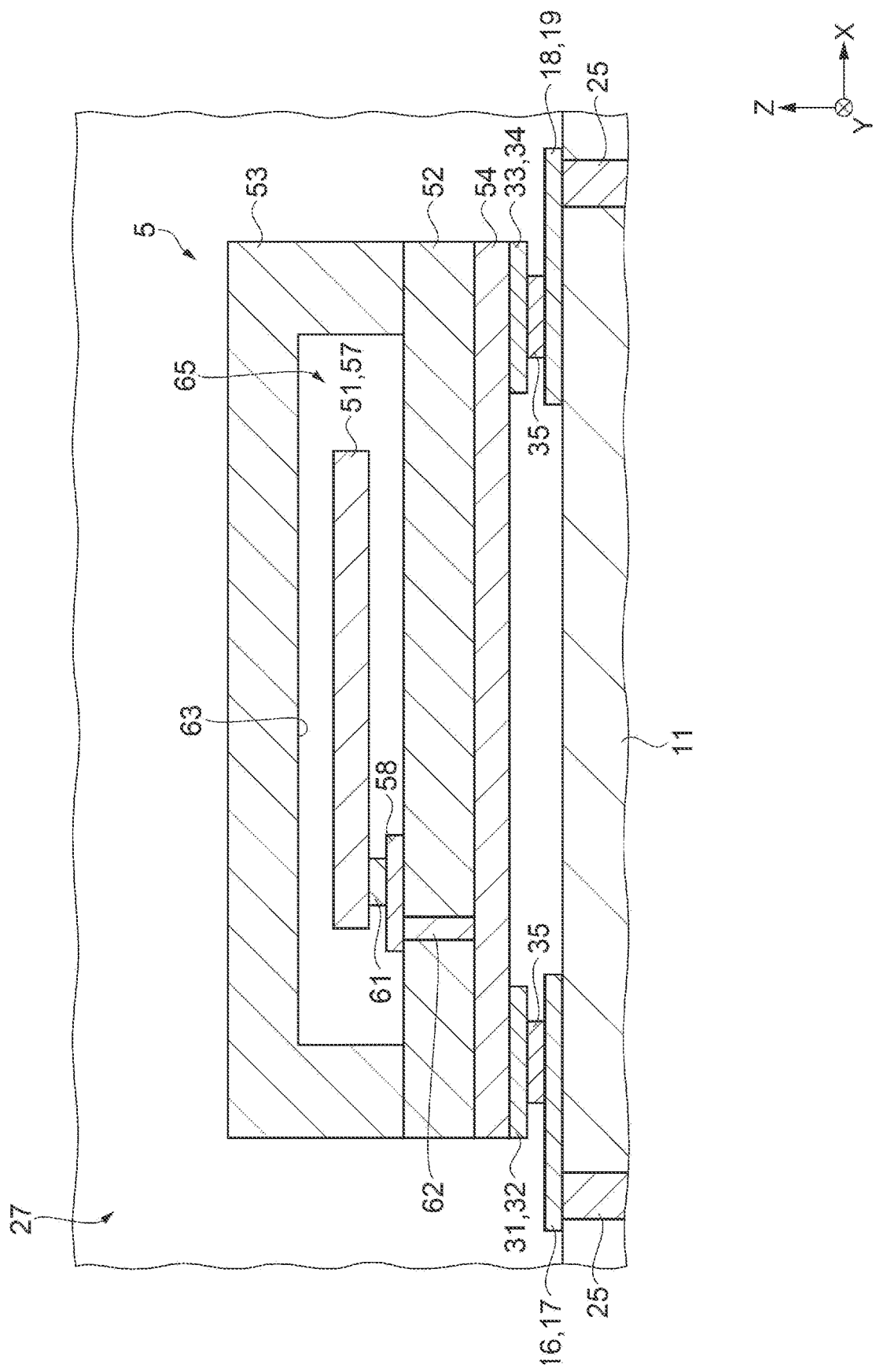
FIG. 4 is a cross-sectional view of a resonator device.

The resonator devices 5 each include a plurality of connection electrodes, as shown in FIGS. 2, 4, and 5. In detail, the resonator devices 5 each include four connection electrodes 31, 32, 33, and 34. The connection electrodes 31, 32, 33, and 34 are disposed at the lower surface of the resonator device 5.

The connection electrodes 31, 32, 33, and 34 and the inner electrodes 16, 17, 18, and 19, which are disposed at the bottom surface of the recess 13, are mechanically and electrically coupled to each other, respectively, via electrically conductive bonding members 35. The bonding members 35 are each, for example, be solder or a metal bump made of gold, copper, or any other metal.

The resonator devices 5 each further include a resonator 51, a first substrate 52, a second substrate 53, and a circuit element 54. The second substrate 53 is disposed so as to sandwich the resonator 51 between the first substrate 52 and the second substrate 53. The second substrate 53, the resonator 51, the first substrate 52, and the circuit element 54 are arranged in this order from above to below. The arrangement described above causes the upper surface of the second substrate 53 to form the upper surface of the resonator device 5 and the lower surface of the circuit element 54 to form the lower surface of the resonator device 5.

The resonator 51 includes a flat-plate-shaped resonator element 57 and a pair of excitation electrodes that are not shown. The pair of excitation electrodes are located at the upper and lower surfaces of the resonator element 57.

The resonator element 57 is formed of a quartz crystal substrate. In detail, the resonator element 57 is formed of an AT-cut quartz crystal substrate. Applying a drive signal to the pair of excitation electrodes can excite the resonator element 57 sandwiched between the pair of excitation electrodes to oscillate in a thickness-sliding oscillation mode.

The resonator 51 does not necessarily have the configuration described above. For example, the resonator 51 is not limited to the flat-plate-shaped resonator 51, which oscillates in a thickness-sliding oscillation mode. For example, the resonator 51 may be a resonator having a plurality of oscillating arms that undergo flexural oscillation in an in-plane direction or a resonator having a plurality of oscillating arms that undergo flexural oscillation in an out-of-plane direction. Furthermore, for example, the resonator element 57 of the resonator 51 may be formed, for example, of an X-cut quartz crystal substrate, a Y-cut quartz crystal substrate, a Z-cut quartz crystal substrate, a BT-cut quartz crystal substrate, an SC-cut quartz crystal substrate, or an ST-cut quartz crystal substrate. Moreover, for example, the resonator 51 may be a resonator using a piezoelectric element other than quartz crystal. Furthermore, for example, the resonator 51 may be a surface acoustic wave (SAW) resonator or a micro-electro-mechanical-systems (MEMS) resonator formed of a piezoelectric element disposed at a semiconductor substrate, such as a silicon substrate.

The first substrate 52 is a base substrate of the resonator device 5. The first substrate 52 is a flat-plate-shaped substrate. The first substrate 52 has a rectangular shape in the plan view.

In the present embodiment, the first substrate 52 is a semiconductor substrate made of a semiconductor such as silicon. It is, however, noted that the first substrate 52 is not limited to a semiconductor substrate and may instead be a quartz crystal or glass substrate.

A pair of mounting electrodes 58 are disposed at the upper surface of the first substrate 52. The mounting electrodes 58 are electrically and mechanically coupled to the resonator 51 via electrically conductive bonding members 61. In detail, one of the pair of mounting electrodes 58 is electrically coupled to the excitation electrode disposed at one surface of the resonator element 57, and the other of the pair of mounting electrodes 58 is electrically coupled to the excitation electrode disposed at the other surface of the resonator element 57.

The bonding members 61 are each a metal bump made of gold or copper.

The circuit element 54 is disposed at the lower surface of the first substrate 52.

The connection electrodes 31, 32, 33, and 34 are disposed at the lower surface of the resonator device 5, that is, the lower surface of the circuit element 54.

The circuit element 54 is an integrated circuit (IC). The circuit element 54 is disposed at the lower surface of the first substrate 52. In the present embodiment, the circuit element 54 is formed as a circuit layer at the lower surface of the first substrate 52, which is a semiconductor substrate, by using a well-known semiconductor device manufacturing technology.

The circuit element 54 has a plurality of electrode pads that are not shown. In detail, the circuit element 54 includes six electrode pads. The six electrode pads include an electrode pad VSS, which is electrically coupled to a ground voltage GND, an electrode pad VDD, which is electrically coupled to a power supply voltage, an electrode pad OUT, via which a frequency signal generated by causing the resonator 51 to oscillate is outputted, an electrode pad OE, to which a control signal that controls the output from the electrode pad OUT is inputted, and a pair of electrode pad XI and XO, via which drive signals that excite the resonator 51 are outputted.

The electrode pads VSS, VDD, OUT, and OE are electrically coupled to the connection electrodes 31, 32, 33, and 34, respectively, via wiring lines that are not shown but are formed in the circuit element 54.

The pair of electrode pads XI and XO are electrically coupled to the pair of mounting electrodes 58, respectively, via pass-through electrodes 62. The pass-through electrodes 62 are each an electrode that passes through the portion between the upper and lower surfaces of the first substrate 52.

The electrode pads XI and XO are electrically coupled to the excitation electrodes disposed at the upper and lower surfaces of the resonator element 57 via the pass-through electrodes 62, the mounting electrodes 58, and the bonding members 61.

In the present embodiment, the circuit element 54 is disposed at the lower surface of the first substrate 52, but may instead be disposed at the upper surface of the first substrate 52.

The second substrate 53 is the lid of the resonator device 5. The second substrate 53 is a box-shaped substrate having the recess 63. The second substrate 53 has a rectangular shape in the plan view.

In the present embodiment, the second substrate 53 is a semiconductor substrate made of a semiconductor such as silicon. It is, however, noted that the second substrate 53 is not limited to a semiconductor substrate and may instead be a quartz crystal or glass substrate.

The recess 63 has an opening at the lower surface of the second substrate 53. The recess 63 has a rectangular shape in the plan view.

The lower surface of the second substrate 53 is bonded to the upper surface of the first substrate 52. The opening of the recess 63 is closed by the first substrate 52 to form a cavity 65 between the first substrate 52 and the second substrate 53.

The cavity 65 is a housing space that houses the resonator 51. When the first substrate 52 and the second substrate 53 are bonded to each other, the resonator 51 is disposed at the upper surface of the first substrate 52 so as to be surrounded by the recess 63, that is, housed in the cavity 65.

The cavity 65 is hermetically sealed by the first substrate 52 and the second substrate 53. The cavity 65 is depressurized. The depressurized cavity 65 can enhance the oscillation characteristics of the resonator 51. It is, however, noted that the cavity 65 does not need to be depressurized.

In the present embodiment, the second substrate 53 and the first substrate 52 are bonded to each other by surface-activated bonding. In detail, the lower surface of the second substrate 53 and the upper surface of the first substrate 52 are irradiated with a high-speed atomic beam so that the lower surface of the second substrate 53 and the upper surface of the first substrate 52 are activated, and the lower surface of the second substrate 53 and the upper surface of the first substrate 52 are then caused to come into contact with each other. The lower surface of the second substrate 53 is thus bonded to the upper surface of the first substrate 52. It is, however, noted that the bonding between the second substrate 53 and the first substrate 52 is not necessarily performed by surface-activated bonding, and any well-known bonding method other than surface-activated bonding may be used.

Figure 6:
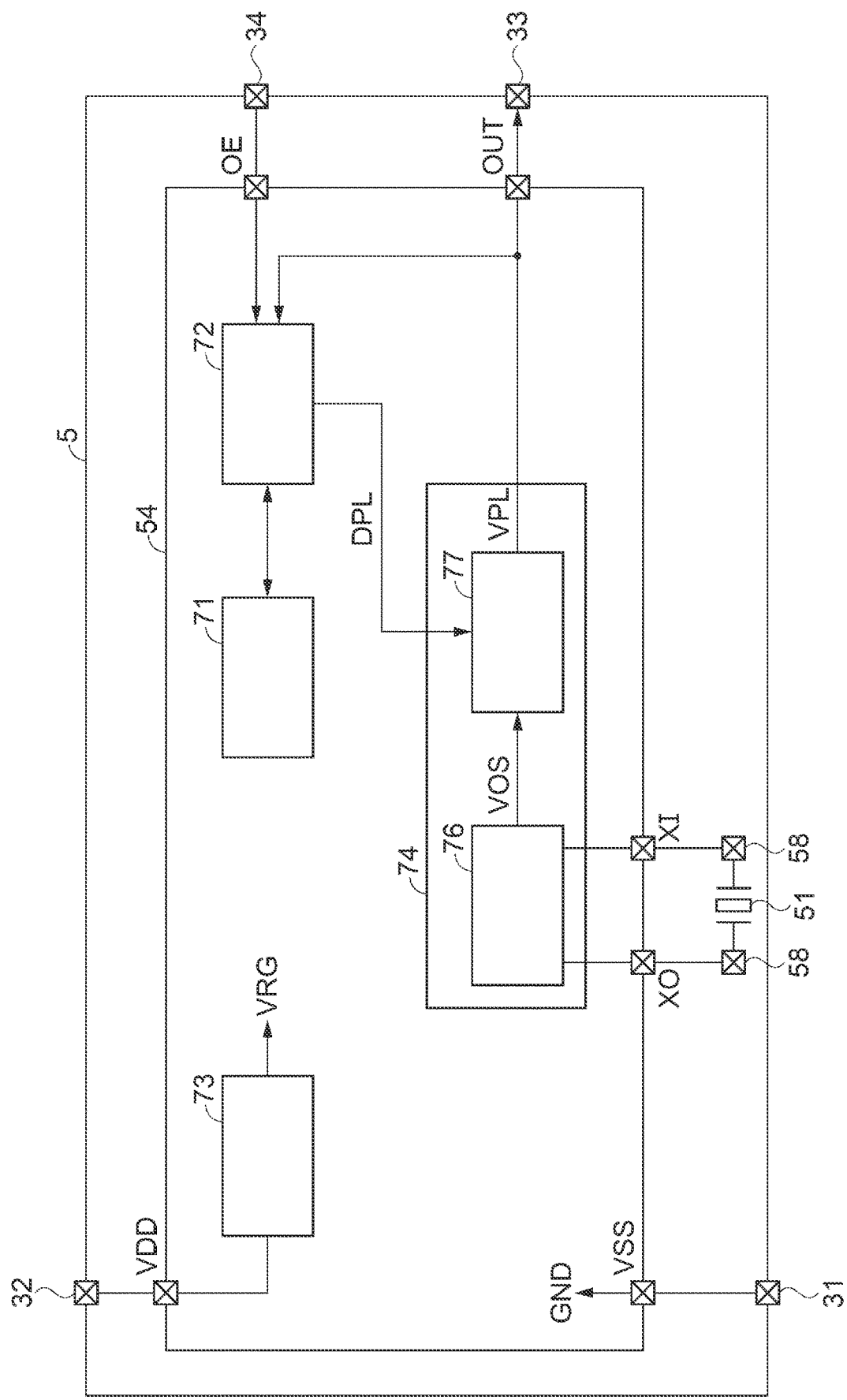
FIG. 6 is a function block diagram of the resonator device.

The resonator device 5 includes the resonator 51 and the circuit element 54, as shown in FIG. 6.

The electrode pads VSS, VDD, OUT, and OE are electrically coupled to the connection electrodes 31, 32, 33, and 34, respectively, as described above. The electrode pads XI and XO are electrically coupled to the resonator 51.

The circuit element 54 includes a storage circuit 71, a logic circuit 72, a bias circuit 73, and an oscillation circuit 74. The circuit element 54 may instead have a configuration in which some of the elements described above are omitted or changed or a configuration in which other elements are added to the elements described above.

The storage circuit 71 stores a variety of pieces of information including characteristic setting information used to set the characteristics of the oscillation circuit 74. When the characteristic setting information is stored in the storage circuit 71, the characteristic setting information is set in the storage circuit 71.

The characteristic setting information used to set the characteristics of the oscillation circuit 74 is information that sets the characteristics of the output from the oscillation circuit 74. The characteristics of the output from the oscillation circuit 74 are the characteristics of an oscillation signal generated by the oscillation circuit 74, for example, the frequency of the oscillation signal generated by the oscillation circuit 74 and the frequency-temperature characteristic of the oscillation signal generated by the oscillation circuit 74. The frequency of the oscillation signal generated by the oscillation circuit 74 is also referred to as an output frequency.

The storage circuit 71 is a nonvolatile memory, for example, an electrically erasable programmable read-only memory (EEPROM).

The logic circuit 72 controls the operation of each of the circuits.

In the present embodiment, the logic circuit 72 reads from the storage circuit 71 the characteristic setting information set in the memory circuit 71 and used to set the characteristics of the oscillation circuit 74. The logic circuit 72 then supplies each of the circuits as appropriate with the characteristic setting information read from the storage circuit 71. The circuits each operate based on the characteristic setting information supplied by the logic circuit 72. The logic circuit 72 can thus cause the oscillation circuit 74 to generate an oscillation signal having predetermined output characteristics based on the characteristic setting information used to set the characteristics of the oscillation circuit 74.

The bias circuit 73 generates a fixed reference voltage VRG based on the power supply voltage supplied from a portion outside the resonator device 5 via the connecting electrode 32 and the electrode pad VDD and the ground voltage GND supplied from a portion outside the resonator device 5 via the connecting electrode 31 and the electrode pad VSS, and supplies each of the circuits with the reference voltage VRG. The bias circuit 73 may generate a variety of reference voltages and supply the circuits with the generated reference voltages as appropriate.

The oscillation circuit 74 is electrically coupled to the resonator 51 and causes the resonator 51 to oscillate. The oscillation circuit 74 then generates the oscillation signal based on the oscillation frequency at which the resonator 51 oscillates. The oscillation signal generated by the oscillation circuit 74 is outputted to a portion outside the resonator device 5 via the electrode pad OUT and the connection electrode 33.

In the present embodiment, the connection electrode 33 is electrically coupled to the outer electrode 23 via the bonding member 35, the inner electrode 18, and the pass-through electrode 25. The oscillation signal generated by the oscillation circuit 74 of the resonator device 5 provided in the first oscillator 2 is therefore outputted via the outer electrode 23 as an oscillation signal that causes the first oscillator 2 to oscillate. That is, the characteristics of the output from the oscillation circuit 74 of the resonator device 5 provided in the first oscillator 2 are the same as the characteristics of the output from the first oscillator 2. The characteristics of the output from the oscillation circuit 74 of the resonator device 5 provided in the first oscillator 2 may therefore be replaced as appropriate with the characteristics of the output from the first oscillator 2.

In the present embodiment, the characteristic setting information set in the storage circuit 71 and used to set the characteristics of the oscillation circuit 74 is information that sets the frequency of the oscillation signal generated by the oscillation circuit 74. In detail, the characteristic setting information set in the storage circuit 71 and used to set the characteristics of the oscillation circuit 74 is the frequency division ratio used by a frequency divider provided in the oscillation circuit 74, as will be described later. The frequency of the oscillation signal generated by the oscillation circuit 74 is set by setting the frequency division ratio used by the frequency divider provided in the oscillation circuit 74.

That is, the frequency of the oscillation signal generated by the oscillation circuit 74 is an example of the characteristics of the output from the oscillation circuit 74. The frequency division ratio used by the frequency divider is an example of the characteristic setting information used to set the characteristics of the oscillation circuit 74, in detail, characteristic setting information that sets the frequency of the oscillation signal generated by the oscillation circuit 74.

In the present embodiment, the oscillation circuit 74 includes a circuit for oscillation 76 and a PLL circuit 77 as a phase locked circuit.

The circuit for oscillation 76 is electrically coupled to the resonator 51 via the electrode pads XI and XO and causes the resonator 51 to oscillate. The circuit for oscillation 76 generates an oscillation signal VOS by causing the resonator 51 to oscillate.

The PLL circuit 77 is a circuit that uses the oscillation signal VOS as a reference signal to generate an oscillation signal VPL synchronized with the reference signal.

In the present embodiment, the oscillation signal VPL generated by the PLL circuit 77 is the oscillation signal generated by the oscillation circuit 74.

The PLL circuit 77 includes a phase comparator, a low-pass filter, a voltage-controlled oscillator, and a frequency divider. The PLL circuit 77 described above has a well-known configuration. The phase comparator, the low-pass filter, the voltage-controlled oscillator, and the frequency divider are therefore not shown or described.

The frequency of the oscillation signal VPL generated by the PLL circuit 77 is a frequency as a result of the arithmetic operation of multiplying the frequency of the oscillation signal VOS by a factor according to the frequency division ratio of the frequency divider provided in the PLL circuit 77.

That is, the frequency of the oscillation signal VPL as the oscillation signal generated by the oscillation circuit 74, that is, the output frequency, can be set by setting the frequency division ratio of the frequency divider provided in the PLL circuit 77.

In the present embodiment, a frequency division ratio DPL of the frequency divider provided in the PLL circuit 77 (oscillation circuit 74) is stored as the characteristic setting information in the storage circuit 71 in the step of manufacturing the first oscillator 2, as will be described later.

The logic circuit 72 reads from the storage circuit 71 the frequency division ratio DPL, which is stored in the storage circuit 71, of the frequency divider and supplies the PLL circuit 77 with the read frequency division ratio DPL. The frequency divider provided in the PLL circuit 77 divides the frequency of the oscillation signal VOS by the frequency division ratio DPL. The frequency of the oscillation signal VPL as the oscillation signal generated by the oscillation circuit 74 is thus a frequency as a result of the arithmetic operation of multiplying the frequency of the oscillation signal VOS by a factor according to the frequency division ratio DPL of the frequency divider.

The configuration of the PLL circuit 77 is not limited to a specific configuration. For example, the PLL circuit 77 may be an integer-N PLL circuit or a fractional-N PLL circuit. The PLL circuit 77 may include both an integer-N PLL circuit and a fractional-N PLL circuit.

The first oscillator 2 has been described.

The second oscillator 3 will next be described with reference to FIGS. 6, 7, and 8.

As described above, the oscillator group 1 is formed of a plurality of types of oscillators including the first oscillator 2 and the second oscillator 3, in which the resonator devices 5 of the same type are housed in the containers 8 and 9 of different types. In other words, the second oscillator 3 is the same as the first oscillator 2 but differs therefrom in that the second container 9, which houses the resonator device 5, differs in type from the first container 8.

The second container 9 will therefore first be described with reference to FIGS. 7 and 8, and the resonator device 5 housed in the second container 9 will then be described with reference to FIG. 6.

Figure 7:
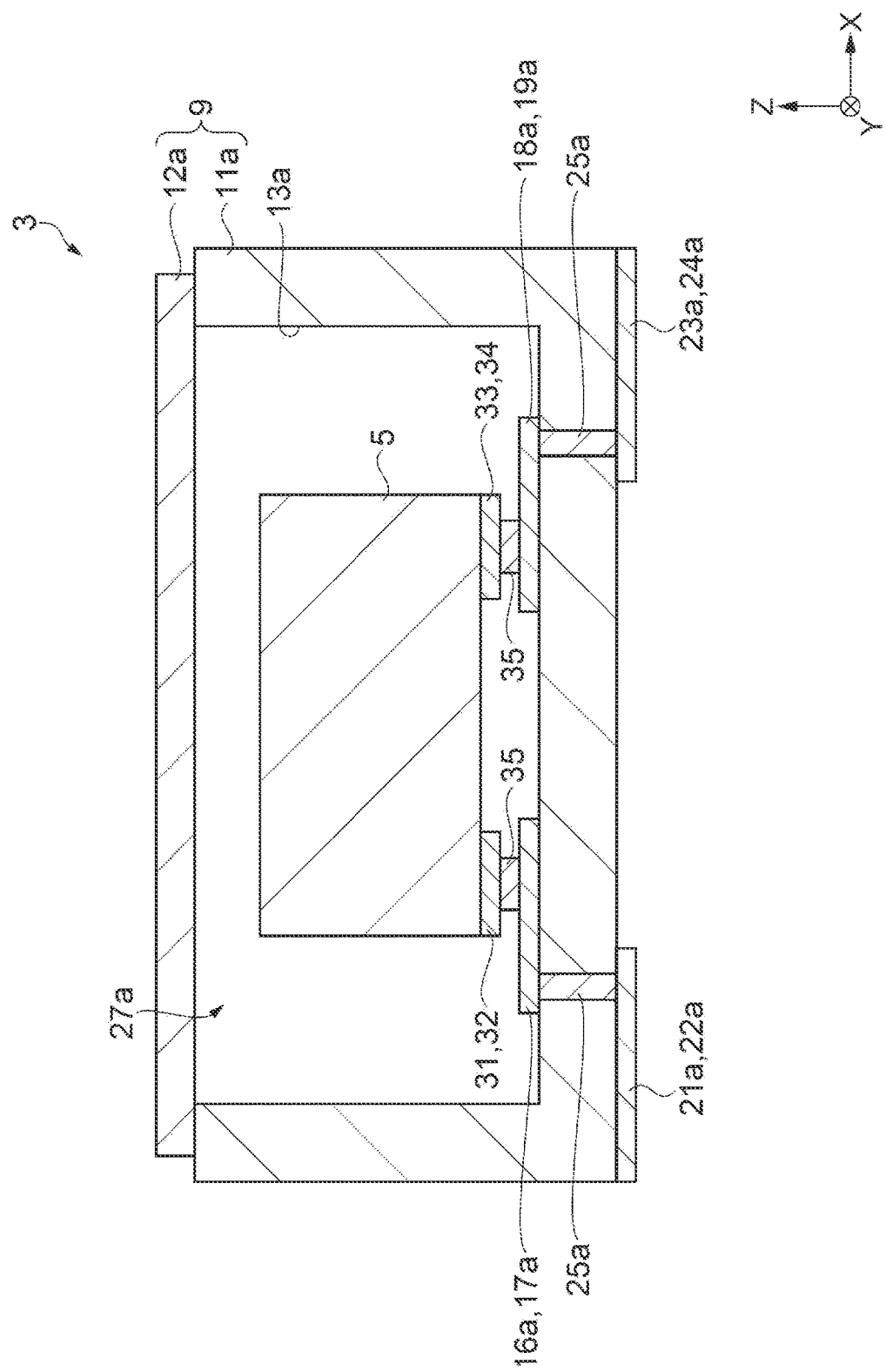
FIG. 7 is a cross-sectional view of a second oscillator according to the first embodiment.

The second oscillator 3 includes the resonator device 5 and the second container 9, which houses the resonator device 5, as shown in FIG. 7.

In the present embodiment, the second container 9 includes a container body 11a and a lid 12a.

The second container 9 is a container different in type from the first container 8. In the present embodiment, the second container 9 differs in shape from the first container 8. In detail, in the plan view, the dimensions of the second container 9 in the directions X and Y are greater than the dimensions of the first container 8 in the directions X and Y, respectively, and in the side view viewed from the direction X or Y, the dimension of the second container 9 in the direction Z is equal to the dimension of the first container 8 in the direction Z.

The container body 11a is a box-shaped container body having a recess 13a, as shown in FIGS. 7 and 8. The container body 11a has a rectangular shape in the plan view.

In the present embodiment, the container body 11a is a ceramic substrate. It is, however, noted that the container body 11a is not limited to a ceramic substrate and may instead, for example, be a semiconductor substrate or a printed circuit board.

The recess 13a has an opening at the upper surface of the container body 11a. The recess 13a has a rectangular shape in the plan view.

A plurality of inner electrodes are disposed at the bottom surface of the recess 13a. In detail, four inner electrodes 16a, 17a, 18a, and 19a are disposed at the bottom surface of the recess 13a.

A plurality of outer electrodes are disposed at the lower surface of the container body 11a. In detail, four outer electrodes 21a, 22a, 23a, and 24a are disposed at the lower surface of the container body 11a.

The outer electrodes 21a, 22a, 23a, and 24a and the inner electrodes 16a, 17a, 18a, and 19a are electrically coupled to each other, respectively, via pass-through electrodes 25a. The pass-through electrodes 25a are each an electrode that passes through the portion between the lower surface of the container body 11a and the bottom surface of the recess 13a.

The lid 12a is a flat-plate-shaped lid. The lid 12a has a rectangular shape in the plan view.

In the present embodiment, the lid 12a is made of metal such as Kovar. It is, however, noted that the lid 12a is not necessarily made of metal and may instead, for example, be a glass or ceramic substrate.

The lower surface of the lid 12a is bonded to the upper surface of the container body 11a via a bonding member that is not shown. The lid 12a is bonded to the container body 11a to close the opening of the recess 13a. A housing space 27a, which houses the resonator device 5, is thus formed between the lid 12a and the container body 11a. The housing space 27a is hermetically sealed by the lid 12a and the container body 11a. The housing space 27a is depressurized. The depressurized housing space 27a allows reduction in heat conduction between the exterior of the second container 9 and the resonator device 5. It is, however, noted that the housing space 27a does not need to be depressurized.

The connection electrodes 31, 32, 33, and 34, which are provided in the resonator device 5, and the inner electrodes 16a, 17a, 18a, and 19a, which are disposed at the bottom surface of the recess 13a, are mechanically and electrically coupled to each other, respectively, via the electrically conductive bonding members 35.

In the present embodiment, the connection electrode 33 is electrically coupled to the outer electrode 23a via the bonding member 35, the inner electrode 18a, and the pass-through electrode 25a. The oscillation signal generated by the oscillation circuit 74 of the resonator device 5 provided in the second oscillator 3 is outputted via the outer electrode 23a as the oscillation signal that causes the second oscillator 3 to oscillate. That is, the characteristics of the output from the oscillation circuit 74 of the resonator device 5 provided in the second oscillator 3 are the same as the characteristics of the output from the second oscillator 3. The characteristics of the output from the oscillation circuit 74 of the resonator device 5 provided in the second oscillator 3 may therefore be replaced as appropriate with the characteristics of the output from the second oscillator 3.

The resonator device 5 provided in the second oscillator 3 is identical in type to the resonator device 5 provided in the first oscillator 2, as shown in FIG. 6. The resonator device 5 provided in the second oscillator 3 includes the circuit element 54. The circuit element 54 includes the storage circuit 71, the logic circuit 72, the bias circuit 73, and the oscillation circuit 74. The oscillation circuit 74 includes the circuit for oscillation 76 and the PLL circuit 77. The PLL circuit 77 includes the phase comparator, the low-pass filter, the voltage-controlled oscillator, and the frequency divider.

In the present embodiment, the frequency division ratio DPL of the frequency divider provided in the oscillation circuit 74 is stored as the characteristic setting information in the storage circuit 71 in the step of manufacturing the second oscillator 3, as will be described later.

The logic circuit 72 reads from the storage circuit 71 the frequency division ratio DPL, which is stored in the storage circuit 71, of the frequency divider and supplies the PLL circuit 77 with the read frequency division ratio DPL. The frequency divider provided in the PLL circuit 77 divides the frequency of the oscillation signal VOS by the frequency division ratio DPL. The frequency of the oscillation signal VPL as the oscillation signal generated by the oscillation circuit 74 is thus a frequency as a result of the arithmetic operation of multiplying the frequency of the oscillation signal VOS by a factor according frequency division ratio DPL of the frequency divider.

The characteristic setting information stored in the storage circuit 71 of the resonator device 5 provided in the second oscillator 3 and the characteristic setting information stored in the storage circuit 71 of the resonator device 5 provided in the first oscillator 2 may be the same or may differ from each other. In the present embodiment, the frequency of the oscillation signal generated by the oscillation circuit 74 of the resonator device 5 provided in the second oscillator 3 and the frequency of the oscillation signal generated by the oscillation circuit 74 of the resonator device 5 provided in the first oscillator 2 can be different from each other by causing the frequency division ratio DPL stored in the storage circuit 71 in the second oscillator 3 and the frequency division ratio DPL stored in the storage circuit 71 in the first oscillator 2 to differ from each other.

That is, the characteristics of the output from the oscillation circuit 74 of the resonator device 5 provided in the second oscillator 3 and the characteristics of the output from the oscillation circuit 74 of the resonator device 5 provided in the first oscillator 2 can be different from each other by causing the characteristic setting information stored in the storage circuit 71 of the resonator device 5 provided in the second oscillator 3 and the characteristic setting information stored in the storage circuit 71 of the resonator device 5 provided in the first oscillator 2 to differ from each other.

As described above, the oscillator group 1 is formed of a plurality of types of oscillators including the first oscillator 2 and the second oscillator 3, in which the resonator devices 5 of the same type are housed in the containers 8 and 9 of different types. That is, since the first oscillator 2 and the second oscillator 3 can include the resonator devices 5 identical to each other, there is no need to separately develop or manufacture the resonator 51, the circuit element 54, and other components in accordance with each of the first oscillator 2 and the second oscillator 3.

The resonator devices 5 each include the storage circuit 71, and the storage circuit 71 stores the characteristic setting information used to set the characteristics of the oscillation circuit 74. Since the characteristics of the output from the oscillation circuit 74 can be readily changed by changing the characteristic setting information stored in the storage circuit 71 and used to set the characteristics of the oscillation circuit 74, the characteristics of the output from the oscillation circuit 74 can be readily set in accordance, for example, with the specifications and other factors of the first oscillator 2 and the second oscillator 3.

Therefore, in the present embodiment, the manufacturing cost of the first oscillator 2 and the second oscillator 3 can be reduced, and the first oscillator 2 and the second oscillator 3 can be efficiently manufactured. That is, a plurality of types of oscillators including different containers and having different characteristics of the output from the oscillators can be efficiently manufactured at low cost.

In the present embodiment, the inner electrodes 16, 17, 18, and 19 in the first container 8 and the inner electrodes 16a, 17a, 18a, and 19a in the second container 9 are located at the same positions. The positions where the connection electrodes 31, 32, 33, and 34 and the inner electrodes 16, 17, 18, and 19 in the resonator device 5 are bonded to each other and the positions where the connection electrodes 31, 32, 33, and 34 and the inner electrodes 16a, 17a, 18a, and 19a in the other resonator device 5 are bonded to each other are therefore the same, as shown in FIGS. 3 and 8.

The resonator devices 5 of the same type can thus be incorporated in the first container 8 and the second container 9, which differ in type from each other, by causing the inner electrodes 16, 17, 18, and 19 in the first container 8 and the inner electrodes 16a, 17a, 18a, and 19a in the second container 9 to be located at the same positions.

In the present embodiment, the inner electrodes 16, 17, 18, and 19 in the first container 8 and the inner electrodes 16a, 17a, 18a, and 19a in the second container 9 have the same dimensions and shape. It is, however, noted that at least one of the dimensions and shape of the inner electrodes 16, 17, 18, and 19 may differ from that of the inner electrodes 16a, 17a, 18a, and 19a, as long as the inner electrodes can be coupled to the connection electrodes 31, 32, 33, and 34 in each of the resonator devices 5, respectively.

The inner electrodes 16, 17, 18, and 19 in the first container 8 are an example of "first to N-th inner electrodes", and the inner electrodes 16a, 17a, 18a, and 19a in the second container 9 are an example of "(N+1)-th to 2N-th inner electrodes". The connection electrodes 31, 32, 33, and 34 in each of the resonator devices 5 are an example of "first to N-th connection electrodes". That is, in the present embodiment, the inner electrode 16 as the first inner electrode in the first container 8 and the inner electrode 16a as the fifth inner electrode in the second container 9 are located at the same position, the inner electrode 17 as the second inner electrode in the first container 8 and the inner electrode 17a as the sixth inner electrode in the second container 9 are located at the same position, the inner electrode 18 as the third inner electrode in the first container 8 and the inner electrode 18a as the seventh inner electrode in the second container 9 are located at the same position, and the inner electrode 19 as the fourth inner electrode in the first container 8 and the inner electrode 19a as the eighth inner electrode in the second container 9 are located at the same position. In the present embodiment, the integer N is four.

It is, however, noted that the number of inner electrodes in each of the first container 8 and the second container 9 and the number of connection electrodes in each of the resonator devices 5 are not limited to four. That is, when the integer N is any integer greater than or equal to two, the first container 8 only needs to be provided with the first to N-th inner electrodes, the second container 9 only needs to be provided with the (N+1)-th to 2N-th inner electrodes, and the resonator devices 5 each only need to include the first to N-th connection electrodes.

The number of inner electrodes in each of the first container 8 and the second container 9 and the number of connection electrodes in each of the resonator devices 5 may be greater than four, for example, in a case where the resonator devices 5 generate differential oscillation signals and the first oscillator 2 and the second oscillator 3 output the differential oscillation signals, or a case where the resonator devices 5 are each provided with a connection electrode corresponding to a specific application thereof, and the connection electrode corresponding to the specific application is electrically coupled to a portion outside the corresponding one of the first container 8 and the second container 9. The specific application is, for example, inspection of the resonator devices 5.

The first oscillator 2 and the second oscillator 3 have been described.

An oscillator manufacturing method according to the present embodiment will next be described with reference to FIGS. 9 and 13. The steps shown in FIGS. 9 to 13 are carried out, for example, by a manufacturing apparatus that is not shown.

Figure 9:
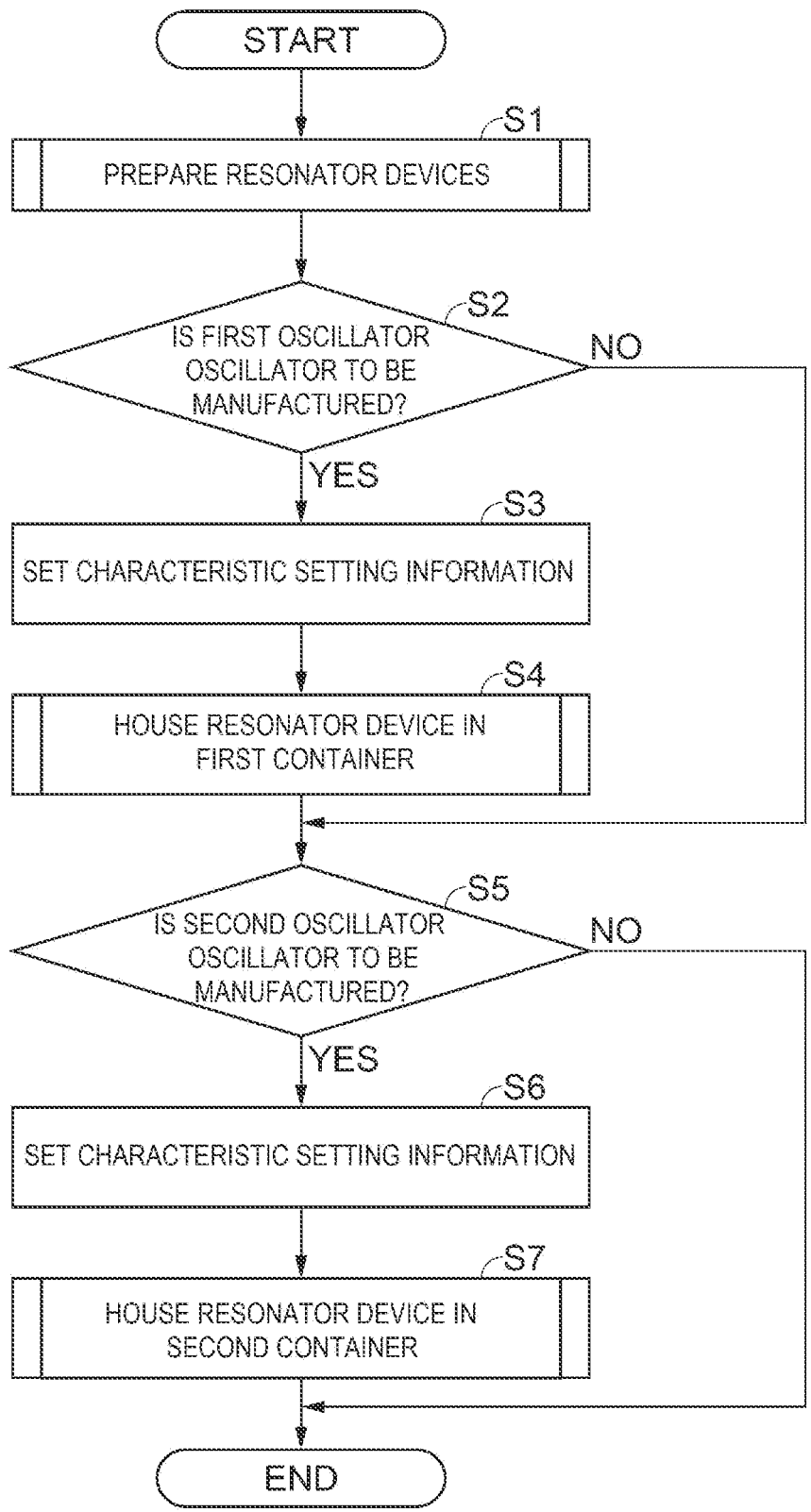
FIG. 9 is a flowchart showing an example of an oscillator manufacturing method according to the first embodiment.

The oscillator manufacturing method according to the present embodiment includes step S1 of preparing the resonator devices 5, step S2 of evaluating whether the oscillator to be manufactured is the first oscillator 2, step S3 of setting the characteristic setting information in the storage circuit 71 of the resonator device 5, step S4 of housing the resonator device 5 in the first container 8 to manufacture the first oscillator 2, step S5 of evaluating whether the oscillator to be manufactured is the second oscillator 3, step S6 of setting the characteristic setting information in the storage circuit 71 of the resonator device 5, and step S7 of housing the resonator device 5 in the second container 9 to manufacture the second oscillator 3, as shown in FIG. 9.

Step S1 is the step of preparing the resonator devices 5.

Figure 10:
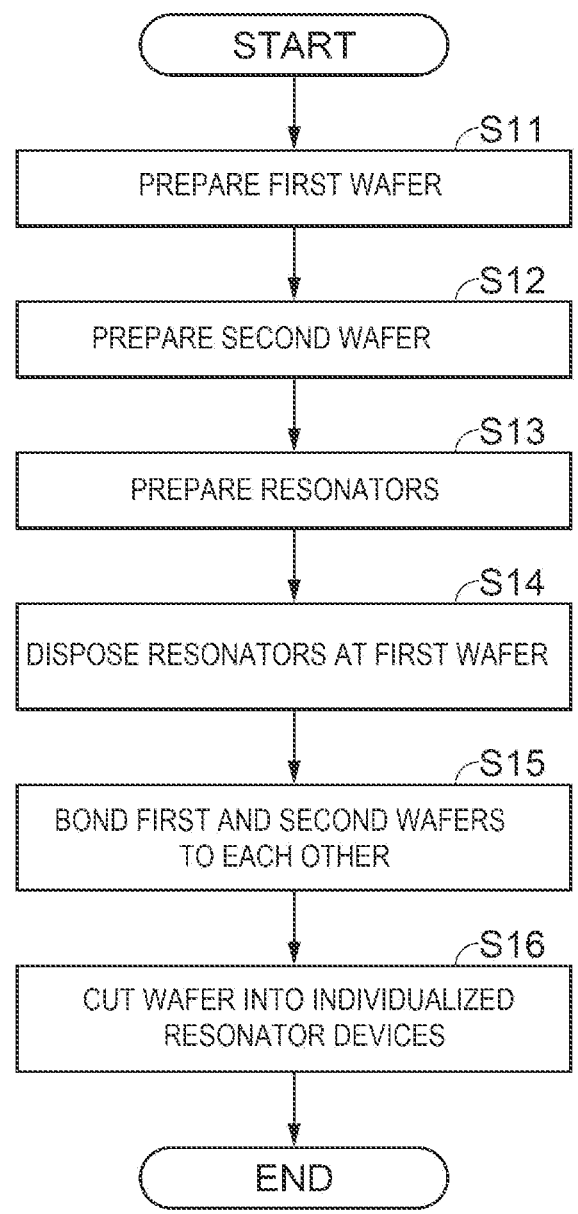
FIG. 10 is a flowchart showing an example of step S1 in FIG. 9.

In the present embodiment, step S1 includes step S11 of preparing a first wafer W1, step S12 of preparing a second wafer W2, step S13 of preparing the resonators 51, step S14 of disposing the resonators 51 at the first wafer W1, step S15 of bonding the first wafer W1 and the second wafer W2 to each other, and step S16 of cutting the wafer into which the first wafer W1 and the second wafer W2 have been bonded to each other into individualized resonator devices 5, as shown in FIG. 10.

Step S11 is the step of preparing the first wafer W1. A plurality of first substrates 52 are formed across the first wafer W1.

The mounting electrodes 58 are disposed at the upper surface of the first wafer W1, which forms the upper surfaces of first substrates 52. In step S14, which will be described later, the resonator 51 is disposed at the upper surface, where the mounting electrodes 58 are disposed, of each of the first substrate 52.

The circuit element 54 is disposed at the lower surface of the first substrate 52, which is the surface opposite from the surface at which the resonator 51 is disposed. The connection electrodes 31, 32, 33, and 34 are disposed at the lower surface of the circuit element 54. The pass-through electrodes 62, which electrically couple the mounting electrodes 58 and the circuit element 54 to each other, are formed therebetween.

In the present embodiment, the first wafer W1 is a semiconductor substrate. The first wafer W1 may instead be a quartz crystal or glass substrate.

In the present embodiment, the circuit element 54 is disposed at the lower surface of the first substrate 52, but may instead be disposed at the upper surface of the first substrate 52. In this case, the pass-through electrodes 62, which electrically couple the mounting electrodes 58 and the circuit element 54 to each other, are not necessary, and pass-through electrodes that electrically couple the circuit element 54 to the connection electrodes 31, 32, 33, and 34 are formed in the first substrate 52.

Figure 11:
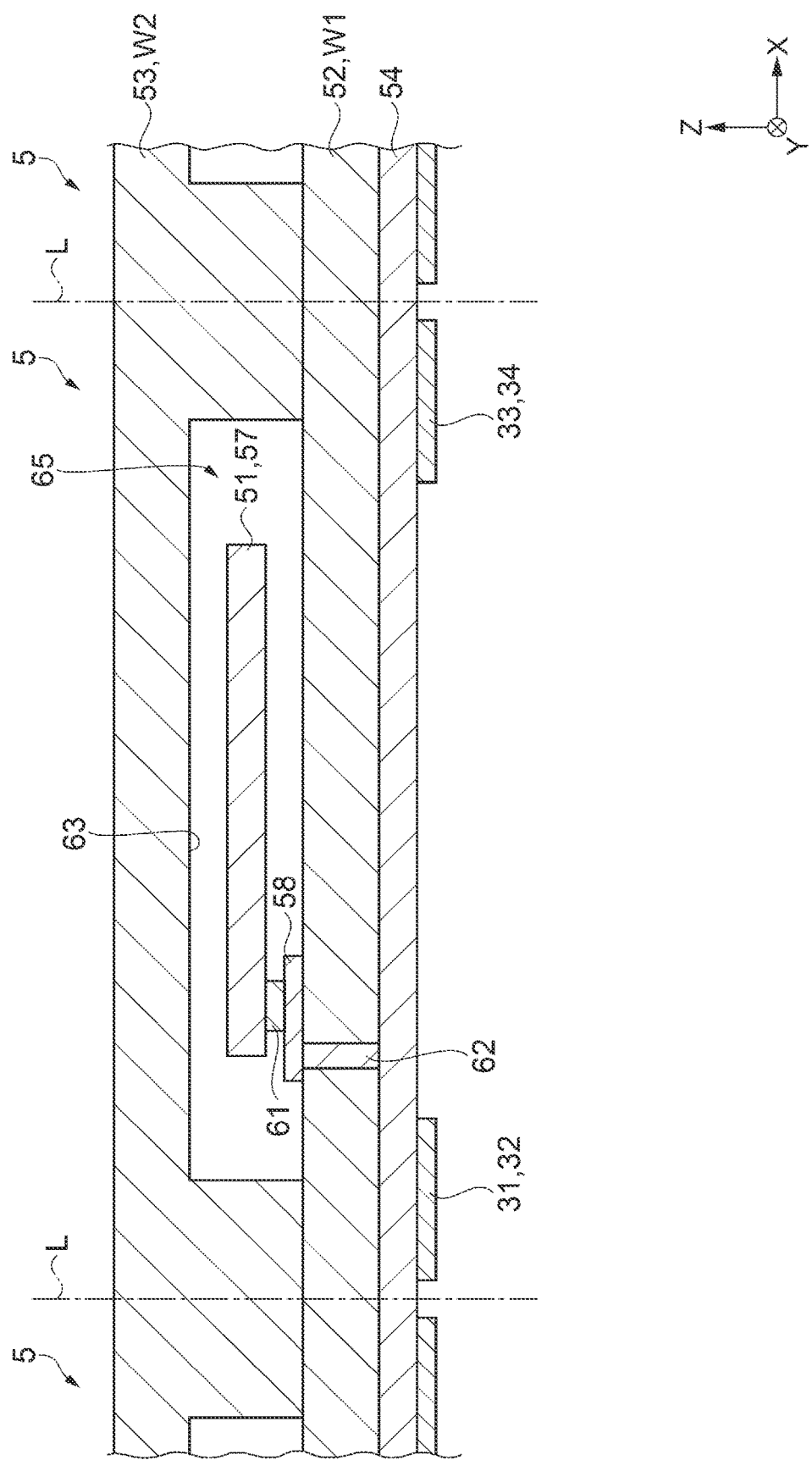
FIG. 11 is a cross-sectional view of a wafer in step S15 in FIG. 10.

Step S12 is the step of preparing the second wafer W2. A plurality of second substrates 53 are formed across the second wafer W2. That is, a plurality of recesses 63 are formed in the second wafer W2, as shown in FIG. 11. The plurality of recesses 63 each have an opening at the lower surface of the second wafer W2, that is, the lower surface of each of the second substrates 53.

In the present embodiment, the second wafer W2 is a semiconductor substrate. The second wafer W2 may instead be a quartz crystal or glass substrate.

Step S13 is the step of preparing the resonators 51.

First, a plurality of resonators 51 are formed in a third wafer that is not shown. In detail, photolithography and etching techniques are used to form a plurality of resonator elements 57 in the third wafer, and sputtering and photolithography techniques are used to form excitation electrodes, wiring lines electrically coupled to the excitation electrodes, and other components at each of the resonator elements 57. The plurality of resonators 51 are thus formed in the third wafer.

The plurality of resonators 51 formed in the third wafer are then cut into individual resonators 51 by using a well-known cutting method.

The resonators 51 can thus be manufactured.

In the present embodiment, the third wafer is a quartz crystal substrate. In detail, the third wafer is an AT-cut quartz crystal substrate. The third wafer may be a quartz crystal substrate other than an AT-cut quartz crystal substrate, may be formed of a piezoelectric element other than quartz crystal, or may be a semiconductor substrate.

Step S14 is the step of disposing the resonators 51 at the first wafer W1. The mounting electrodes 58, which have been disposed at the upper surface of the first wafer W1, and the resonators 51 are bonded to each other via the bonding members 61, as shown in FIG. 11. The resonators 51 are thus disposed at the first wafer W1.

Step S15 is the step of bonding the first wafer W1 and the second wafer W2 to each other.

The first wafer W1 and the second wafer W2 are bonded to each other to produce a wafer in which a plurality of resonator devices 5 are formed in a batch process, as shown in FIG. 11.

In step S15, the lower surface of the second wafer W2 and the upper surface of the first wafer W1 are bonded to each other. The openings of the recesses 63 are closed by the first wafer W1 to form a plurality of cavities 65 between the first wafer W1 and the second wafer W2.

When the first wafer W1 and the second wafer W2 are bonded to each other, the resonators 51 are disposed so as to be housed in the plurality of cavities 65.

In other words, step S15 is the step of bonding the first wafer W1 and the second wafer W2 to each other with the resonators 51 disposed so as to be housed in the plurality of cavities 65 formed between the first wafer W1 and the second wafer W2.

In the present embodiment, the bonding between the first wafer W1 and the second wafer W2 is performed by surface-activated bonding. It is, however, noted that the bonding between the first wafer W1 and the second wafer W2 is not necessarily performed by surface-activated bonding, but any well-known bonding method other than surface-activated bonding may be used.

Step S16 is the step of cutting the wafer into which the first wafer W1 and the second wafer W2 have been bonded to each other into a plurality of individualized resonator devices 5 formed in the wafer.

The plurality of resonator devices 5 formed in the wafer into which the first wafer W1 and the second wafer W2 have been bonded to each other are cut or folded and broken along imaginary lines L shown in FIG. 11 to produce individual resonator devices 5.

A well-known method can be used to produce the individualized resonator devices 5 by cutting or folding and breaking the wafer into which the first wafer W1 and the second wafer W2 have been bonded to each other. For example, a dicing saw may be used to perform full-cut dicing of the wafer. Instead, half-cut dicing using a dicing saw or stealth dicing using a laser beam is so performed that uncut portions are formed, and the uncut portions may then be broken.

The resonator devices 5 can thus be manufactured by carrying out steps S11 to S16.

Since steps S11 to S16 allow batch manufacture of the resonator devices 5, which are components common to the first oscillator 2 and the second oscillator 3, the oscillator group 1 including the first oscillator 2 and the second oscillator 3 can be efficiently manufactured.

Step S1 has been described.

Returning back to FIG. 9, step S2 and the following steps will be described.

Step S2 is the step of evaluating whether the oscillator to be manufactured is the first oscillator 2. In step S2, when the oscillator to be manufactured is the first oscillator 2, step S2 transitions to step S3. In step S2, when the oscillator to be manufactured is not the first oscillator 2, step S2 transitions to step S5.

Step S3 is the step of setting the characteristic setting information in the storage circuit 71 provided in the resonator device 5. In detail, in step S3, the characteristic setting information is so set in the storage circuit 71 that the first oscillator 2 has desired output characteristics. In the present embodiment, the characteristic setting information used to set the output frequency of the output from the first oscillator 2 is set in the storage circuit 71.

In the present embodiment, the characteristic setting information used to set the output frequency of the output from the first oscillator 2 is information used to set the output frequency of the output from the oscillation circuit 74 provided in the resonator device 5. In detail, the characteristic setting information used to set the output frequency of the output from the oscillation circuit 74 is the frequency division ratio DPL of the PLL circuit 77 provided in the oscillation circuit 74. That is, in the present embodiment, the characteristic setting information set in the storage circuit 71 is the frequency division ratio DPL of the PLL circuit 77.

In the present embodiment, in step S3, the connection electrodes 33 and 34 of the resonator device 5 are electrically coupled to an external apparatus that is not shown. For example, the external apparatus can be electrically coupled to the resonator device 5 by bringing a probe or any other portion of the external apparatus into contact with the connection electrodes 33 and 34 of the resonator device 5.

The connection electrodes 33 and 34 of the resonator device 5 are electrically coupled to the electrode pads OUT and OE of the circuit element 54, respectively. The circuit element 54 can therefore perform data communication with the external apparatus via the connection electrodes 33 and 34 and the electrode pads OUT and OE. The logic circuit 72 provided in the circuit element 54 performs data communication with the external apparatus and causes the storage circuit 71 to store the characteristic setting information transmitted from the external apparatus. When the characteristic setting information is stored in the storage circuit 71, the characteristic setting information is set in the storage circuit 71.

Step S4 is the step of housing the resonator device 5 in the first container 8 to manufacture the first oscillator 2.

Figure 12:
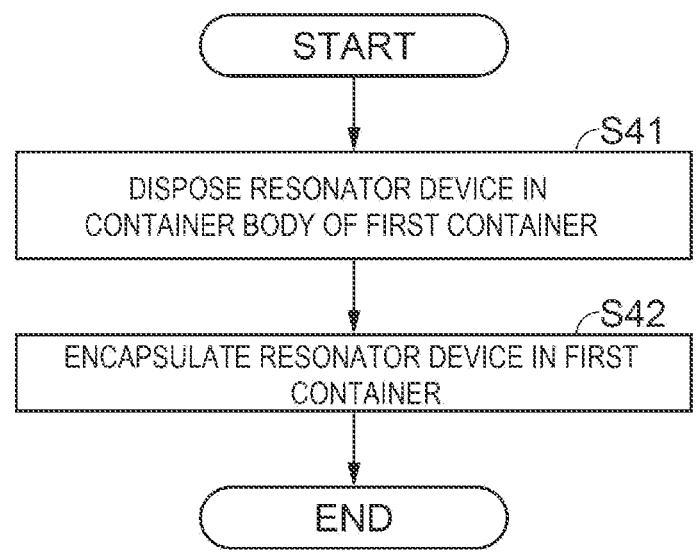
FIG. 12 is a flowchart showing an example of step S4 in FIG. 9.
Figure 13:
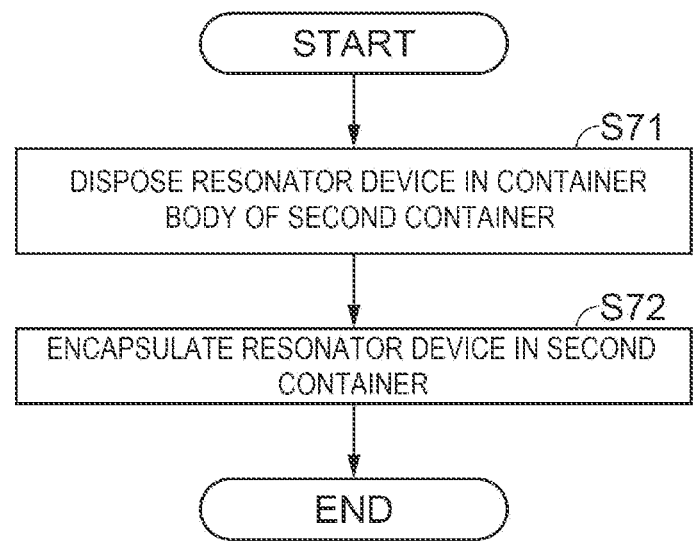
FIG. 13 is a flowchart showing an example of step S7 in FIG. 9.

In the present embodiment, step S4 includes step S41 of disposing the resonator device 5 in the container body 11 of the first container 8, and step S42 of encapsulating the resonator device 5 in the first container 8, as shown in FIG. 12.

Step S41 is the step of disposing the resonator device 5 in the container body 11 of the first container 8.

The connection electrodes 31, 32, 33, and 34 of the resonator device 5 and the inner electrodes 16, 17, 18, and 19, which are disposed at the bottom surface of the recess 13 of the container body 11, are mechanically and electrically coupled to each other, respectively, via the electrically conductive bonding members 35, as shown in FIG. 2.

The resonator device 5 is thus disposed in the container body 11 of the first container 8.

Step S42 is the step of encapsulating the resonator device 5 in the first container 8.

The lower surface of the lid 12 of the first container 8 is bonded to the upper surface of the container body 11 via a bonding member that is not shown, as shown in FIG. 2. The housing space 27, which houses the resonator device 5, is thus formed between the lid 12 and the container body 11. The housing space 27 is hermetically sealed by the lid 12 and the container body 11.

The first oscillator 2 can thus be manufactured by carrying out steps S41 and S42 to house the resonator device 5 in the first container 8.

Returning back to FIG. 9, step S5 and following steps will be described.

Step S5 is the step of evaluating whether the oscillator to be manufactured is the second oscillator 3. In step S5, when the oscillator to be manufactured is the second oscillator 3, step S5 transitions to step S6. In the present embodiment, in step S5, when the oscillator to be manufactured is not the second oscillator 3, the manufacture of the oscillator is terminated.

Step S6 is the step of setting the characteristic setting information in the storage circuit 71 provided in the resonator device 5. In detail, in step S6, the characteristic setting information is so set in the storage circuit 71 that the second oscillator 3 has desired output characteristics. In more detail, in the present embodiment, the characteristic setting information used to set the output frequency of the output from the second oscillator 3 is set in the storage circuit 71.

Step S6 is the same as step S3 but differs therefrom in that the characteristic setting information is so set in the storage circuit 71 that the second oscillator 3 has desired output characteristics. Step S6 will therefore not be described in detail.

Step S7 is the step of housing the resonator device 5 in the second container 9 to manufacture the second oscillator 3.

In the present embodiment, step S7 includes step S71 of disposing the resonator device 5 in the container body 11a of the second container 9, and step S72 of encapsulating the resonator device 5 in the second container 9, as shown in FIG. 13.

Step S71 is the step of disposing the resonator device 5 in the container body 11a of the second container 9.

The connection electrodes 31, 32, 33, and 34 of the resonator device 5 and the inner electrodes 16a, 17a, 18a, and 19a, which are disposed at the bottom surface of the recess 13a of the container body 11a, are mechanically and electrically coupled to each other, respectively, via the electrically conductive bonding members 35, as shown in FIG. 7.

The resonator device 5 is thus disposed in the container body 11a of the second container 9.

Step S72 is the step of encapsulating the resonator device 5 in the second container 9.

The lower surface of the lid 12a of the second container 9 is bonded to the upper surface of the container body 11a via a bonding member that is not shown, as shown in FIG. 7. The housing space 27a, which houses the resonator device 5, is thus formed between the lid 12a and the container body 11a. The housing space 27a is hermetically sealed by the lid 12a and the container body 11a.

The second oscillator 3 can thus be manufactured by carrying out steps S71 and S72 to house the resonator device 5 in the second container 9.

Returning back to FIG. 9, when step S7 is completed, the manufacture of the oscillators is completed.

The oscillator manufacturing method according to the present embodiment has been described.

According to the oscillator manufacturing method described above, a plurality of types of oscillators including the first oscillator 2 and the second oscillator 3 can be manufactured by housing the resonator devices 5 of the same type in the first container 8 and the second container 9, respectively, which are containers of different types. That is, since the first oscillator 2 and the second oscillator 3 can include the resonator devices 5 identical to each other, there is no need to separately develop or manufacture the resonator 51, the circuit element 54, and other components in accordance with each of the first oscillator 2 and the second oscillator 3.

The resonator devices 5 each include the storage circuit 71, and the storage circuit 71 stores the characteristic setting information used to set the characteristics of the oscillation circuit 74. Since the characteristics of the output from the oscillation circuit 74 can be readily changed by changing the characteristic setting information stored in the storage circuit 71 and used to set the characteristics of the oscillation circuit 74, the characteristics of the output from the oscillation circuit 74 can be readily set in accordance, for example, with the specifications and other factors of the first oscillator 2 and the second oscillator 3.

Therefore, in the present embodiment, the manufacturing cost of the first oscillator 2 and the second oscillator 3 can be reduced, and the first oscillator 2 and the second oscillator 3 can be efficiently manufactured. That is, a plurality of types of oscillators including different containers and having different characteristics of the output from the oscillators can be efficiently manufactured at low cost.

The configurations of the first oscillator 2 and the second oscillator 3 and the method for manufacturing the same are not limited to the configurations and the manufacturing method described above, and a variety of variations are conceivable within the scope of the substance of the present disclosure.

In the present embodiment, the first container 8 provided in the first oscillator 2 includes the lid 12, and the housing space 27, which houses the resonator device 5, is hermetically sealed when the lid 12 is bonded to the container body 11. Similarly, the second container 9 provided in the second oscillator 3 includes the lid 12a, and the housing space 27a, which houses the resonator device 5, is hermetically sealed when the lid 12a is bonded to the container body 11a.

It is, however, noted that the housing space 27 formed in the first container 8 and the housing space 27a formed in the second container 9 does not need to be hermetically sealed. That is, the first container 8 does not need to include the lid 12, and the second container 9 does not need to include the lid 12a.

When the first container 8 does not include the lid 12, the step S42 shown in FIG. 12 is not necessary. When the second container 9 does not include the lid 12a, the step S72 shown in FIG. 13 is not necessary.

One of the first container 8 and the second container 9 may include the lid 12 or 12a, and the other of the first container 8 and the second container 9 may not include the lid 12a or 12. In the configuration described above, the first container 8 and the second container 9 may differ in type from each other by differentiating the shapes of the first container 8 and the second container 9 from each other. In other words, the first container 8 and the second container 9 may differ in type from each other by employing a configuration in which the housing space 27 or 27a of one of the first container 8 and the second container 9 is hermetically sealed and the other housing space is not sealed.

In the present embodiment, the oscillation circuit 74 includes the PLL circuit 77, the storage circuit 71 stores the frequency division ratio DPL of the frequency divider provided in the PLL circuit 77 as the characteristic setting information, and the output frequency as the characteristics of the output from the oscillation circuit 74 is set based on the frequency division ratio DPL. It is, however, noted that the configuration of the oscillation circuit 74, the characteristics of the output therefrom, and the characteristic setting information stored by the storage circuit 71 are not limited to those described above.

For example, the oscillation circuit 74 may include a waveform shaping circuit, the storage circuit 71 may store waveform setting information used to set the waveform of the oscillation signal generated by the oscillation circuit 74, and the oscillation circuit 74 may generate an oscillation signal having a shaped waveform based on the waveform setting information. The waveform of the oscillation signal is an example of the characteristics of the output from the oscillation circuit 74, and the waveform setting information is an example of the characteristic setting information. The waveform of the oscillation signal can, for example, be a CMOS waveform or a clipped sinusoidal waveform.

In the present embodiment, step S3 is followed by step S4, as shown in FIG. 9, but step S4 may be followed by step S3. When step S4 is followed by step S3, for example, a probe or any other portion of the external apparatus can be electrically coupled to the electrode pads OUT and OE of the circuit element 54 via the corresponding pass-through electrodes 25, the inner electrodes 18 and 19, and the connection electrodes 33 and 34 of the resonator device 5 by bringing the probe or any other portion of the external apparatus into contact with the outer electrodes 23 and 24 of the first container 8. Similarly, step S6 is followed by step S7, as shown in FIG. 9, but step S7 may be followed by step S6.

The present embodiment can provide the effects below, as described above.

The oscillator manufacturing method described above is a method for manufacturing a plurality of types of oscillators including the first oscillator 2 and the second oscillator 3, and includes preparing the resonator devices 5 each including the resonator 51, the oscillation circuit 74 electrically coupled to the resonator 51, and the storage circuit 71, which stores the characteristic setting information used to set the characteristics of the oscillation circuit 74, housing the resonator device 5 in the first container 8 to manufacture the first oscillator 2, housing the resonator device 5 in the second container 9 different in type from the first container 8 to manufacture the second oscillator 3, and setting the characteristic setting information in the storage circuit 71, and the resonator device 5 housed in the first container 8 and the resonator device 5 housed in the second container 9 are the resonator devices of the same type.

A plurality of types of oscillators including different containers and having different characteristics of the output from the oscillators can thus be efficiently manufactured at low cost.

2. Second Embodiment

The oscillator manufacturing method according to a second embodiment will next be described.

The first oscillator 2 and the second oscillator 3 manufactured by the oscillator manufacturing method according to the present embodiment are the same as the first oscillator 2 and the second oscillator 3 manufactured by the oscillator manufacturing method according to the first embodiment except that resonator devices 5a in place of the resonator devices 5 are housed in the first container 8 and the second container 9. The resonator devices 5 and resonator devices 5a have the same function but have different configurations.

In other words, the oscillator manufacturing method according to the present embodiment is the same as the oscillator manufacturing method according to the first embodiment except that step S1 of preparing the resonator device 5a differs from step S1 in the first embodiment.

The same configurations as those in the first embodiment described above have the same reference characters and will not be described.

The resonator devices 5a will be described with reference to FIGS. 14 to 18.

Figure 14:
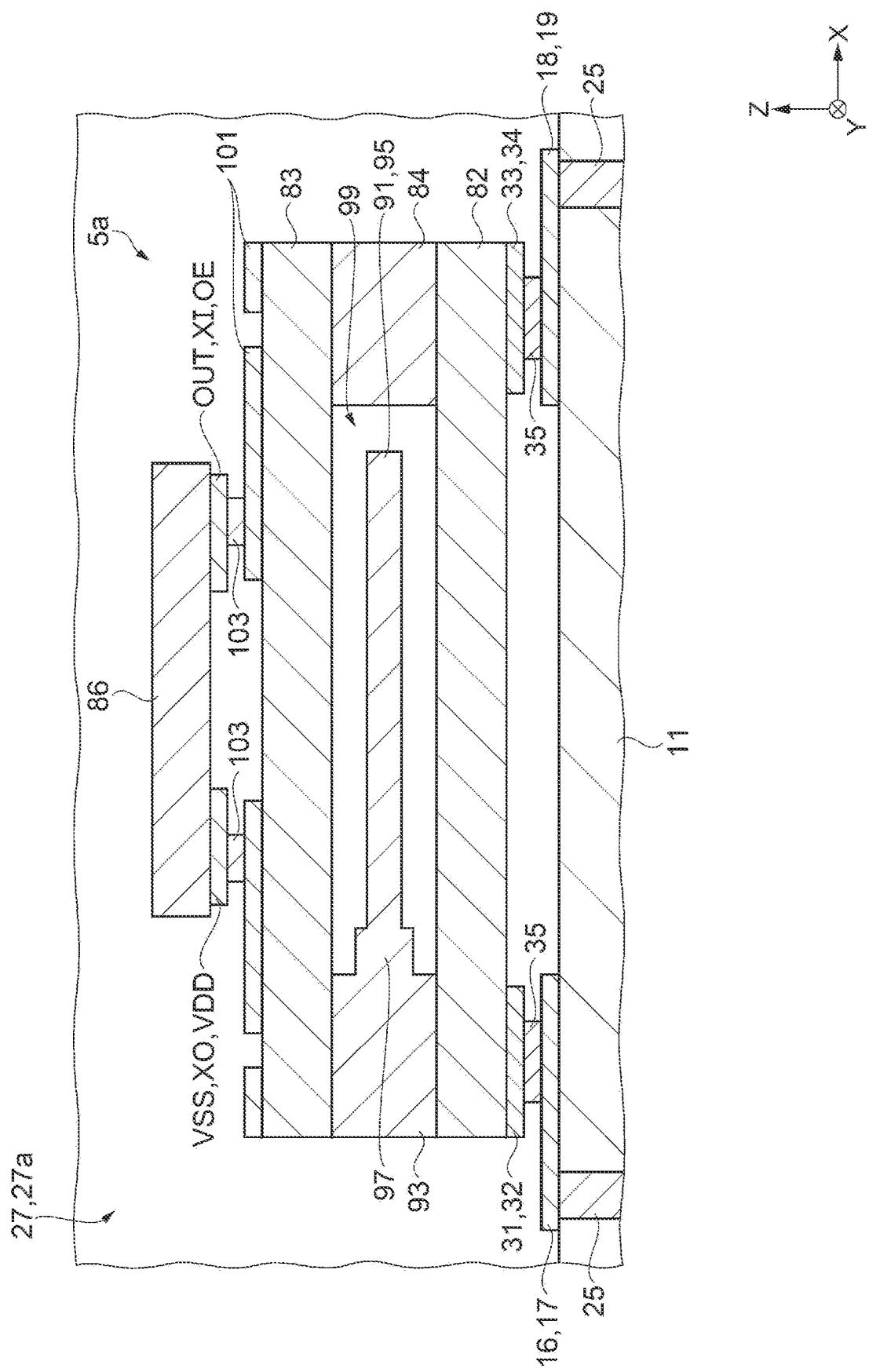
FIG. 14 is a cross-sectional view of the resonator device according to a second embodiment.

The resonator devices 5a each include a first substrate 82, a second substrate 83, a third substrate 84, and a circuit element 86, as shown in FIG. 14.

The second substrate 83 is disposed so as to sandwich a resonator 91 between the first substrate 82 and the second substrate 83. That is, the third substrate 84 is disposed between the first substrate 82 and the second substrate 83.

The third substrate 84 includes the resonator 91 and a frame 93, which surrounds the resonator 91. That is, the resonator device 5a includes the third substrate 84, which includes the resonator 91 and the frame 93, which surrounds the resonator 91, between the first substrate 82 and the second substrate 83.

The circuit element 86, the second substrate 83, the third substrate 84, and the first substrate 82, are arranged in this order from above to below. The arrangement described above causes the lower surface of the first substrate 82 to form the lower surface of the resonator device 5a.

The connection electrodes 31, 32, 33, and 34 are disposed at the lower surface of the resonator device 5a. When the resonator device 5a is housed in the first container 8, the connection electrodes 31, 32, 33, and 34 are bonded to the inner electrodes 16, 17, 18, and 19 provided in the first container 8, respectively, via the bonding members 35. When the resonator device 5a is housed in the second container 9, the connection electrodes 31, 32, 33, and 34 are bonded to the inner electrodes 16a, 17a, 18a, and 19a provided in the second container 9, respectively, via the bonding members 35.

The first substrate 82 is the base substrate of the resonator device 5a. The first substrate 82 is a flat-plate-shaped substrate. The first substrate 82 has a rectangular shape in the plan view.

In the present embodiment, the first substrate 82 is a quartz crystal substrate. It is, however, noted that the first substrate 82 is not limited to a quartz crystal substrate and may instead be a semiconductor, glass, or resin film substrate.

The second substrate 83 is the lid of the resonator device 5a. The second substrate 83 is a flat-plate-shaped substrate. The second substrate 83 has a rectangular shape in the plan view.

In the present embodiment, the second substrate 83 is a quartz crystal substrate. It is, however, noted that the second substrate 83 is not limited to a quartz crystal substrate and may instead be a semiconductor, glass, or resin film substrate.

The third substrate 84 is a quartz crystal substrate. In the present embodiment, the third substrate 84 is an AT-cut quartz crystal substrate. The third substrate 84 is not limited to an AT-cut quartz crystal substrate and may instead, for example, be an X-cut quartz crystal substrate, a Y-cut quartz crystal substrate, a Z-cut quartz crystal substrate, a BT-cut quartz crystal substrate, an SC-cut quartz crystal substrate, or an ST-cut quartz crystal substrate.

When the first substrate 82, the second substrate 83, and the third substrate 84 are each formed of a quartz crystal substrate, the first substrate 82, the second substrate 83, and the third substrate 84 can have approximately the same coefficient of thermal expansion. As a result, thermal stress induced by the difference in the coefficient of thermal expansion among the first substrate 82, the second substrate 83, and the third substrate 84 is unlikely to be induced, stress is unlikely to be induced in the resonator 91.

The first substrate 82 and the second substrate 83 may each be an AT-cut quartz crystal substrate cut at the same angle as the angle at which the third substrate 84 is cut, or a quartz crystal substrate cut at an angle different from the angle at which the third substrate 84 is cut. When the first substrate 82 and the second substrate 83 are each formed of an AT-cut quartz crystal substrate cut at the same angle as the angle at which the third substrate 84 is cut, thermal stress induced by the difference in the coefficient of thermal expansion among the first substrate 82, the second substrate 83, and the third substrate 84 is further unlikely to be induced.

Figure 15:
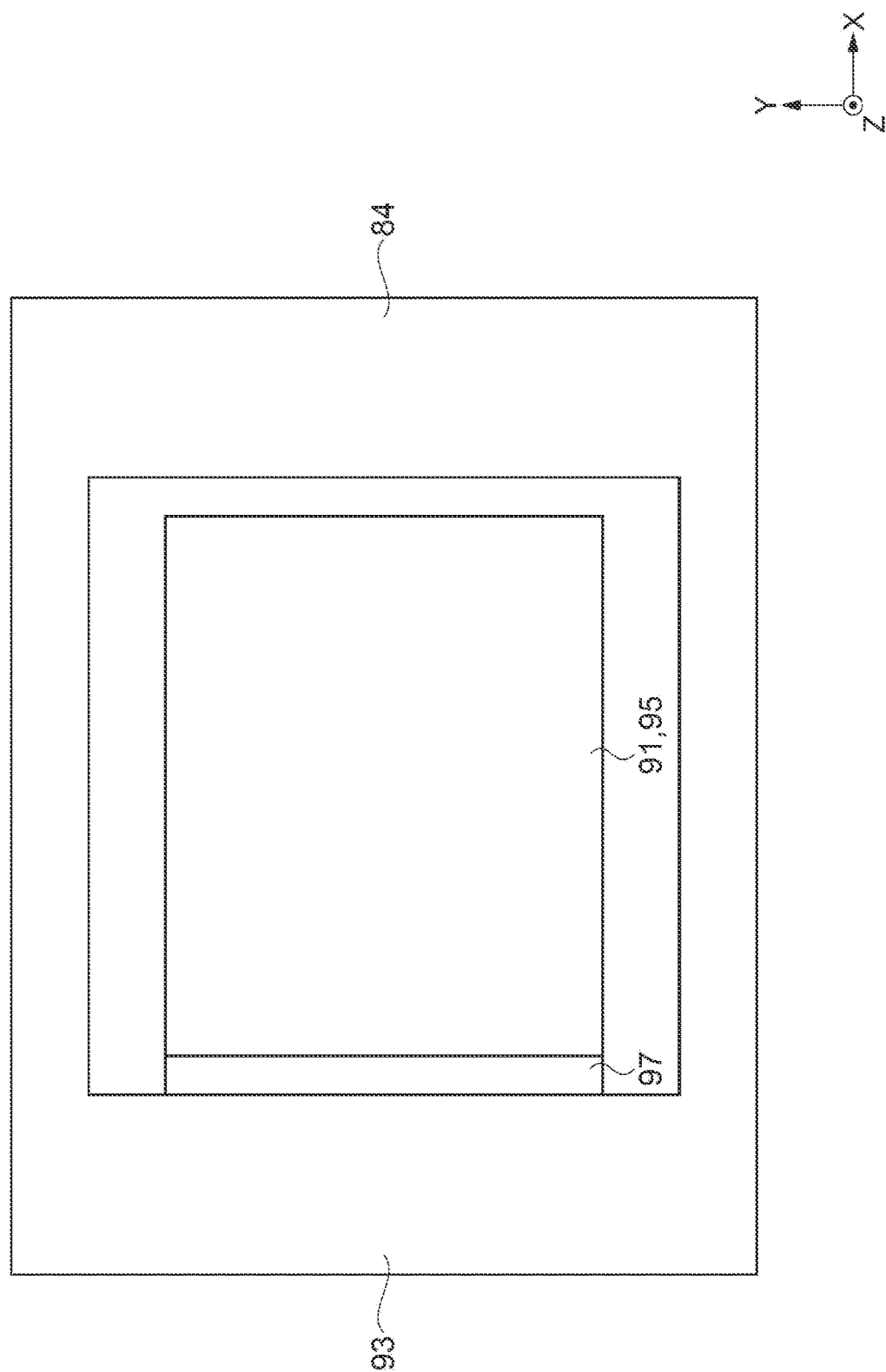
FIG. 15 is a plan view of a third substrate.

The third substrate 84 includes the resonator 91 and the frame 93, which surrounds the resonator 91, as shown in FIGS. 14 and 15. In detail, the third substrate 84 includes the resonator 91, the frame 93, and a linker 97.

The resonator 91 includes a resonator element 95 and a pair of excitation electrodes that are not shown.

The resonator element 95 is a flat-plate-shaped element. The resonator element 95 is thinner than the frame 93 in the direction Z, with the upper surface of the resonator element 95 shifted from the upper surface of the frame 93 toward the negative side of the direction Z, and the lower surface of the resonator element 95 shifted from the lower surface of the frame 93 toward the positive side of the direction Z.

The pair of excitation electrodes are located at the upper and lower surfaces of the resonator element 95.

The frame 93 is a frame-shaped portion in the plan view and is disposed so as to surround the resonator element 95. The resonator element 95 is disposed inside the frame 93 in the plan view. The linker 97 links the resonator element 95 to the frame 93.

The upper surface of the frame 93 is the upper surface of the third substrate 84, and the lower surface of the frame 93 is the lower surface of the third substrate 84.

The upper surface of the first substrate 82 is bonded to the lower surface of the frame 93, and the upper surface of the frame 93 is bonded to the lower surface of the second substrate 83, as shown in FIG. 14. A cavity 99, which houses the resonator 91, is thus formed between the first substrate 82 and the second substrate 83.

The cavity 99 is a housing space that houses the resonator 91. The cavity 99 is hermetically sealed by the first substrate 82, the frame 93 of the third substrate 84, and the second substrate 83. The cavity 99 is depressurized. The depressurized cavity 99 can enhance the oscillation characteristics of the resonator 91. It is, however, noted that the cavity 99 does not need to be depressurized.

In the present embodiment, the first substrate 82, the second substrate 83, and the third substrate 84 are bonded to each other by metal diffusion bonding. In detail, a bonding layer that is not shown is disposed at each of the upper surface of the first substrate 82, the lower surface of the frame 93, the upper surface of the frame 93, and the lower surface of the second substrate 83. The bonding layers are each disposed so as to surround the cavity 99 in the plan view. The bonding layers are formed so as to coincide with one another in the plan view when the first substrate 82, the second substrate 83, and the third substrate 84 are bonded to each other. The bonding layers are made, for example, of gold or copper. After the surfaces of each of the bonding layers are cleaned, the bonding layer disposed at the upper surface of the first substrate 82 is brought into contact with the bonding layer disposed at the lower surface of the frame 93, and the bonding layer disposed at the upper surface of the frame 93 is brought into contact with the bonding layer disposed at the lower surface of the second substrate 83. As a result, the upper surface of the first substrate 82 is bonded to the lower surface of the frame 93 via the bonding layer, and the upper surface of the frame 93 is bonded to the lower surface of the second substrate 83 via the bonding layer. The first substrate 82, the second substrate 83, and the third substrate 84 are thus bonded to each other. It is, however, noted that the bonding between the first substrate 82, the second substrate 83, and the third substrate 84 is not necessarily performed by metal diffusion bonding, but any well-known bonding method other than metal diffusion bonding may be used.

Figure 16:
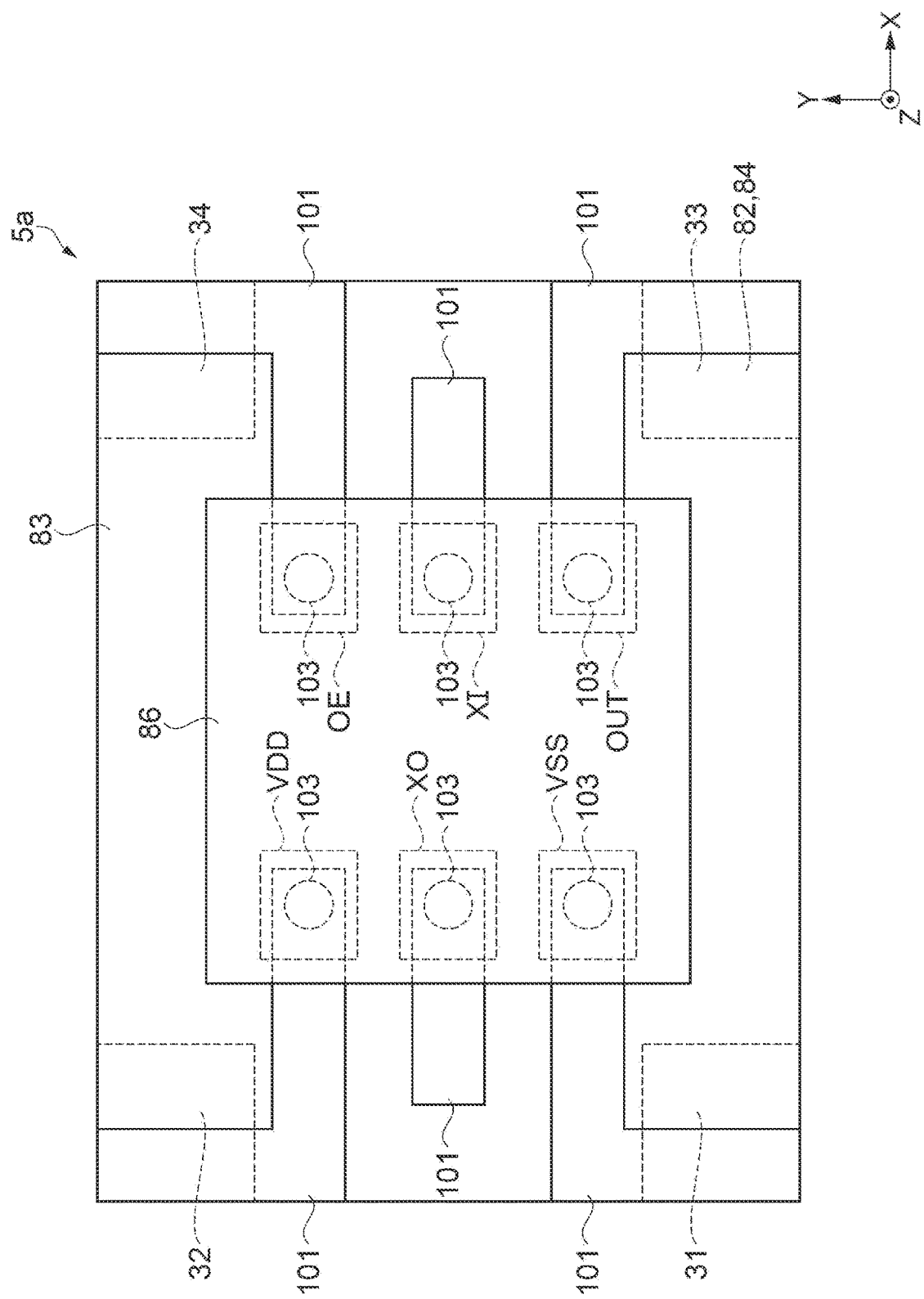
FIG. 16 is a plan view of the resonator device.

A wiring pattern 101 is disposed at the upper surface of the second substrate 83, as shown in FIGS. 14 and 16.

The circuit element 86 is disposed at the upper surface of the second substrate 83.

The circuit element 86 is an IC chip. The circuit element 86 includes a plurality of electrode pads. In detail, the circuit element 86 includes six electrode pads. The six electrode pads are disposed at the lower surface of the circuit element 86. The six electrode pads include the electrode pad VSS, which is electrically coupled to the ground voltage GND, the electrode pad VDD, which is electrically coupled to the power supply voltage, the electrode pad OUT, via which a frequency signal generated by causing the resonator 91 to oscillate is outputted, the electrode pad OE, to which the control signal that controls the output from the electrode pad OUT is inputted, and the pair of electrode pad XI and XO, via which drive signals that excite the resonator 91 are outputted.

The circuit element 86 has the same circuit and functions as those of the circuit element 54 in the first embodiment.

In detail, the circuit element 86 includes the storage circuit 71, the logic circuit 72, the bias circuit 73, and the oscillation circuit 74. The oscillation circuit 74 includes the circuit for oscillation 76 and the PLL circuit 77. The storage circuit 71 stores a variety of pieces of information including the characteristic setting information used to set the characteristics of the oscillation circuit 74. When the characteristic setting information is stored in the storage circuit 71, the characteristic setting information is set in the storage circuit 71. The circuits provided in the circuit element 86 correspond to the circuits provided in the circuit element 54 shown in FIG. 6. The circuits provided in the circuit element 86 will therefore not be described in detail.

The electrode pads VSS, VDD, OUT, OE, XI, and XO are mechanically and electrically coupled to the wiring pattern 101 via electrically conductive bonding members 103. The bonding members 103 are each, for example, a metal bump made of gold or copper.

Although not shown in the present embodiment, pass-through electrodes and wiring lines for electrically coupling the electrode pads VSS, VDD, OUT, and OE to the connection electrodes 31, 32, 33, and 34, respectively, are formed in the first substrate 82, the second substrate 83, and the third substrate 84. Furthermore, although not shown, pass-through electrodes and wiring lines for electrically coupling the electrode pads XI and XO to the pair of excitation electrodes provided at the resonator 91, respectively, are formed in the first substrate 82 and the second substrate 83. The pass-through electrodes and wiring lines, which are not shown, thus electrically couple the electrode pads VSS, VDD, OUT, and OE to the connection electrodes 31, 32, 33, and 34, respectively, and further electrically couple the electrode pads XI and XO to the pair of excitation electrodes provided at the resonator 91, respectively.

In the present embodiment, a structure in which the first substrate 82 and the third substrate 84 are bonded to each other and the second substrate 83 and the third substrate 84 are bonded to each other is also called a resonator unit. The upper surface of the resonator unit is the upper surface of the second substrate 83, and the lower surface of the resonator unit is the lower surface of the first substrate 82. The structure produced by coupling the circuit element 86 to the wiring pattern 101 disposed at the upper surface of the resonator unit via the bonding members 103 is the resonator device 5a. In other words, the structure from which the bonding members 103 and the circuit element 86 are removed from the resonator device 5a is the resonator unit.

The resonator device 5a has been described.

The oscillator manufacturing method according to the present embodiment will next be described.

The first oscillator 2 and the second oscillator 3 according to the present embodiment are the same as the first oscillator 2 and the second oscillator 3 according to the first embodiment except that resonator devices 5a in place of the resonator devices 5 are housed in the first container 8 and the second container 9, as described above. The first oscillator 2 and the second oscillator 3 according to the present embodiment can therefore be manufactured based on the flowchart shown in FIG. 9, as in the first embodiment. In the present embodiment, however, the details of step S1 differ from those in the first embodiment in the flowchart shown in FIG. 9.

Step S1 will therefore be described with reference to FIG. 17.

In the present embodiment, step S1 is the step of preparing the resonator device 5a.

Figure 17:
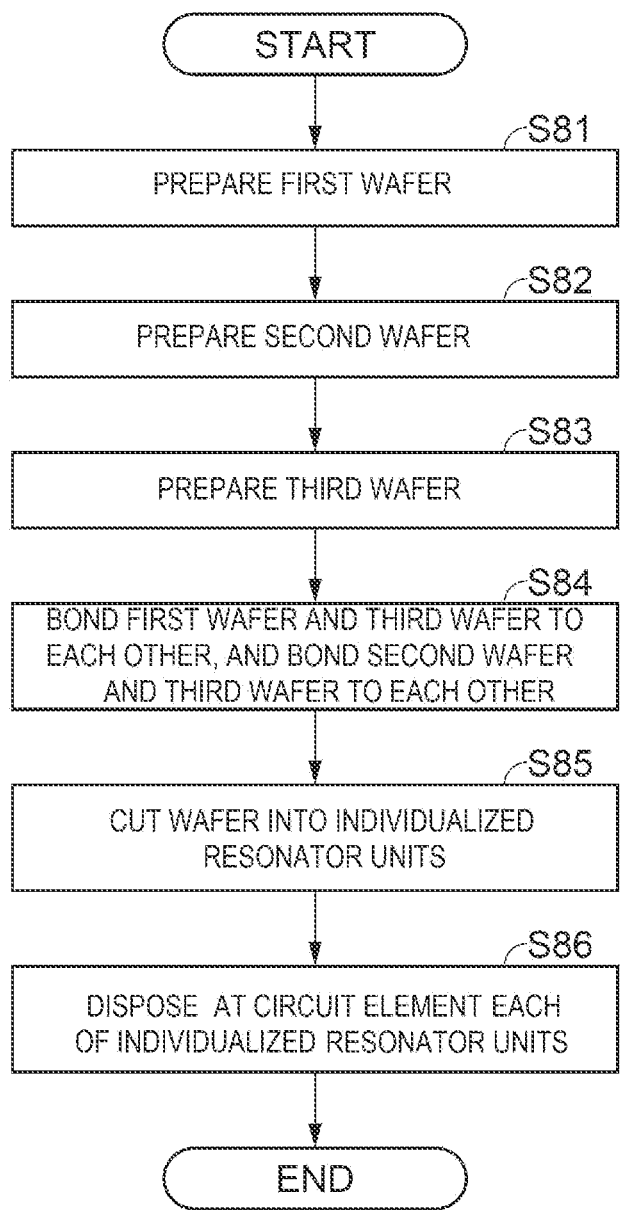
FIG. 17 is a flowchart showing another example of step S1 in FIG. 9.

In the present embodiment, step S1 includes step S81 of preparing a first wafer W1a, step S82 of preparing a second wafer W2a, step S83 of preparing a third wafer W3a, step S84 of bonding the first wafer W1a and the third wafer W3a to each other and bonding the second wafer W2a and the third wafer W3a to each other, step S85 of cutting the wafer into which the first wafer W1a, the second wafer W2a, and the third wafer W3a are bonded to each other into individualized resonator units, and step S86 of disposing the circuit element 86 in each of the individualized resonator units, as shown in FIG. 17.

Step S81 is the step of preparing the first wafer W1a. A plurality of first substrates 82 are formed across the first wafer W1a. The connection electrodes 31, 32, 33, and 34 are disposed at the lower surface of the first wafer W1a, which forms the lower surfaces of the first substrates 82. Pass-through electrodes and wiring lines that are not shown are formed in the first wafer W1a. The pass-through electrodes and wiring lines, which are not shown, are electrically coupled to the connection electrodes 31, 32, 33, and 34. The pass-through electrodes and wiring lines, which are not shown, are electrically coupled to pass-through electrodes and wiring lines that are not shown but are formed in the third wafer W3a when the first wafer W1a and the third wafer W3a are bonded to each other in step S84, which will be described later.

A bonding layer that is not shown is disposed at the upper surface of the first wafer W1a, which forms the upper surfaces of the first substrates 82. The bonding layer is bonded to a bonding layer that is not shown but is disposed at the lower surface of the third wafer W3a when the first wafer W1a and the third wafer W3a are bonded to each other in step S84, which will be described later. The bonding layer disposed at the upper surface of the first wafer W1a may function as wiring lines electrically coupled to through electrodes that are not shown.

In the present embodiment, the first wafer W1a is a quartz crystal substrate. It is noted that the first substrate W1a may be a semiconductor, glass, or resin film substrate.

Step S82 is the step of preparing the second wafer W2a. A plurality of second substrates 83 are formed across the second wafer W2a. The wiring pattern 101 is disposed at each portion of the upper surface of the second wafer W2a, which forms the upper surfaces of the second substrates 83. Pass-through electrodes and wiring lines that are not shown are formed in the second wafer W2a. The pass-through electrodes and wiring lines, which are not shown, are electrically coupled to the wiring pattern 101. The pass-through electrodes and wiring lines, which are not shown, are electrically coupled to the pass-through electrodes and wiring lines that are not shown but are formed in the third wafer W3a when the second wafer W2a and the third wafer W3a are bonded to each other in step S84, which will be described later.

A bonding layer that is not shown is disposed at the lower surface of the second wafer W2a, which forms the lower surfaces of the second substrates 83. The bonding layer is bonded to a bonding layer that is not shown but is disposed at the upper surface of the third wafer W3a when the second wafer W2a and the third wafer W3a are bonded to each other in step S84, which will be described later. The bonding layer disposed at the lower surface of the second wafer W2a may function as wiring lines electrically coupled to pass-through electrodes that are not shown.

In the present embodiment, the second wafer W2a is a quartz crystal substrate. It is noted that the second substrate W2a may be a semiconductor, glass, or resin film substrate.

Step S83 is the step of preparing the third wafer W3a. A plurality of resonators 91, a plurality of frames 93, and a plurality of linkers 97 are formed across the third wafer W3a.

In detail, photolithography and etching techniques are used to form the plurality of resonator elements 95, the plurality of frames 93, and the plurality of linkers 97 across the third wafer W3a. Thereafter, sputtering and photolithography techniques are used to dispose the excitation electrodes that are not shown at the upper and lower surfaces of each of the resonator element 95 to form the resonator 91.

The plurality of resonators 91, the plurality of frames 93, and the plurality of linkers 97 are thus formed across the third wafer W3a.

The plurality of frames 93 are disposed so as to surround the plurality of resonators 91 in the plan view.

Pass-through electrodes and wiring lines that are not shown are formed in the third wafer W3a. A portion of the pass-through electrodes and wiring lines, which are not shown, are electrically coupled to the excitation electrodes. The pass-through electrodes and wiring lines, which are not shown, are coupled as appropriate to the pass-through electrodes and wiring lines that are not shown but are formed in the first wafer W1a and the second wafer W2a when the first wafer W1a and the third wafer W3a are bonded to each other and the second wafer W2a and the third wafer W3a are bonded to each other in step S84, which will be described later.

A bonding layer that is not shown is disposed at each of the upper and lower surfaces of each of the frames 93. The bonding layer disposed at the lower surface of each of the frames 93 is bonded to the bonding layer that is not shown but is disposed at the upper surface of the first wafer W1a when the first wafer W1a and the third wafer W3a are bonded to each other in step S84, which will be described later. The bonding layer disposed at the upper surface of each of the frames 93 is bonded to the bonding layer that is not shown but is disposed at the lower surface of the second wafer W2a when the second wafer W2a and the third wafer W3a are bonded to each other. The bonding layers disposed at the upper and lower surfaces of each of the frames 93 may function as wiring lines electrically coupled to through electrodes that are not shown.

In the present embodiment, the third wafer W3a is a quartz crystal substrate. In detail, the third wafer W3a is an AT-cut quartz crystal substrate. The third wafer W3a may be a quartz crystal substrate other than an AT-cut quartz crystal substrate, may be formed of a piezoelectric element other than quartz crystal, or may be a semiconductor substrate.

Step S84 is the step of bonding the first wafer W1a and the third wafer W3a to each other and the second wafer W2a and the third wafer W3a to each other. In detail, step S84 is the step of bonding the first wafer W1a to one surface of each of the frames 93 formed in the third wafer W3a, and the second wafer W2a to the other surface of each of the frames 93 formed in the third wafer W3a. In more detail, step S84 is the step of bonding the upper surface of the first wafer W1a to the lower surfaces of the frames 93, and the lower surface of the second wafer W2a to the upper surfaces of the frames 93.

Figure 18:
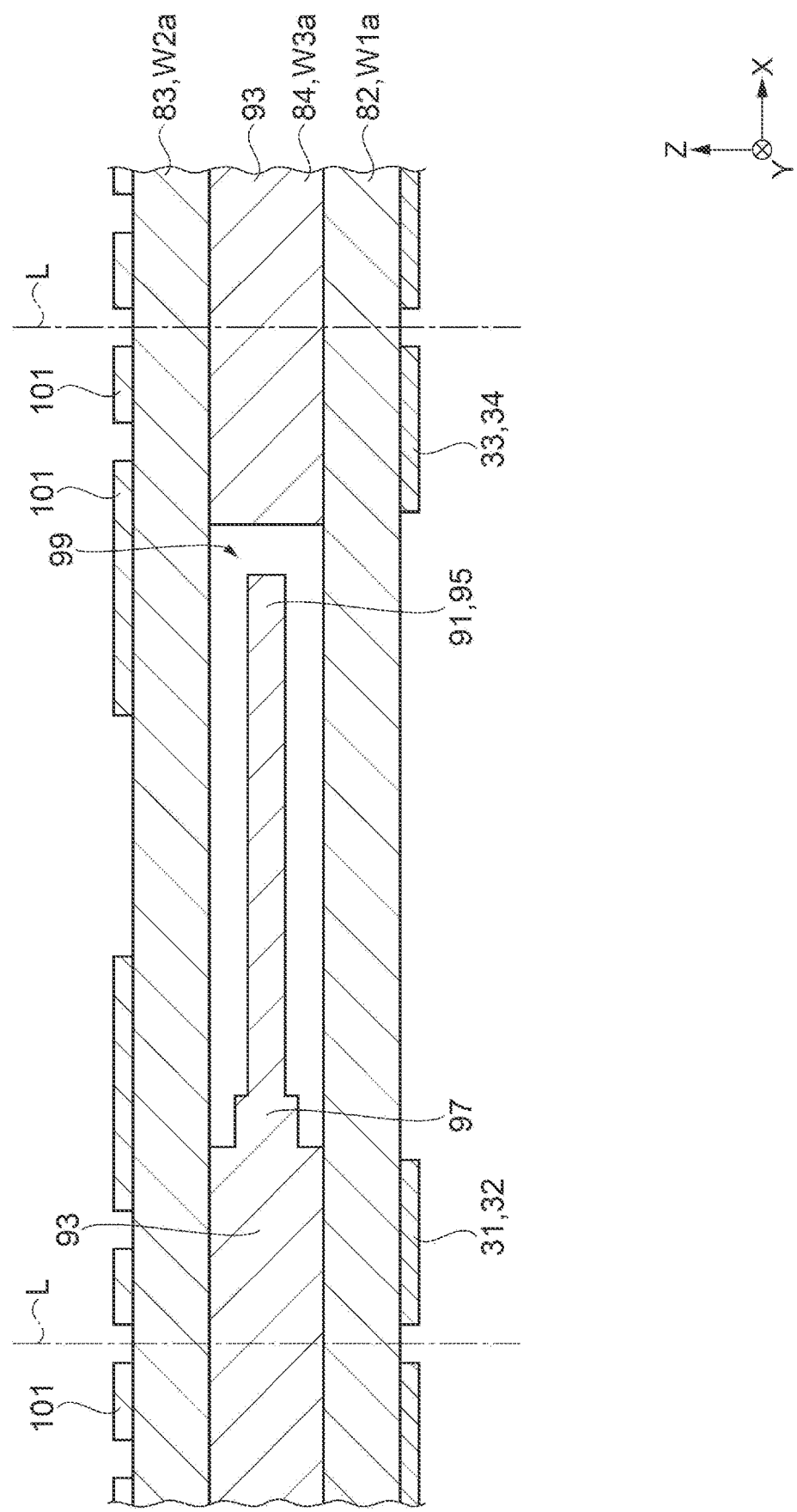
FIG. 18 is a cross-sectional view of a wafer in step S84 in FIG. 17.

Bonding the first wafer W1a and the third wafer W3a to each other and the second wafer W2a and the third wafer W3a to each other can produce a wafer in which a plurality of resonator units are formed in a batch process, as shown in FIG. 18.

Bonding the first wafer W1a and the frames 93 to each other and the second wafer W2a and the frames 93 to each other allows formation of a plurality of cavities 99 between the first wafer W1a and the second wafer W2a. The cavities 99 are hermetically sealed by the first wafer W1a, the frames 93, and the second substrate W2a.

The plurality of frames 93 are disposed so as to surround the plurality of respective resonators 91 in the plan view, as described above. That is, when the first wafer W1a and the frames 93 are bonded to each other, and the second wafer W2a and the frames 93 are bonded to each other, the resonators 91 are disposed inside the frames 93 in the plan view so as to be housed in the plurality of respective cavities 99.

In other words, step S84 is the step of bonding the first wafer W1a and the second wafer W2a to each other with the resonators 91 disposed so as to be housed in the plurality of respective cavities 99 formed between the first wafer W1a and the second wafer W2a.

In the present embodiment, the bonding between the first wafer W1a and the frame 93 is performed by bonding between the bonding layer disposed at the upper surface of the first wafer W1a and the bonding layer disposed at the lower surface of each of the frames 93. The bonding between the bonding layer disposed at the upper surface of the first wafer W1a and the bonding layer disposed at the lower surface of each of the frames 93 is performed by metal diffusion bonding. Similarly, the bonding between the second wafer W2a and the frames 93 is performed by bonding between the bonding layer disposed at the lower surface of the second wafer W2a and the bonding layer disposed at the upper surface of each of the frames 93. The bonding between the bonding layer disposed at the lower surface of the second wafer W2a and the bonding layer disposed at the upper surface of each of the frames 93 is performed by metal diffusion bonding.

It is, however, noted that the bonding between the first wafer W1a and the frames 93 and the bonding between the second wafer W2a and the frames 93 are not necessarily performed by metal diffusion bonding, but any well-known bonding method other than metal diffusion bonding may be used.

Step S85 is the step of cutting the wafer into which the first wafer W1a and the third wafer W3a have been bonded to each other and the second wafer W2a and the third wafer W3a have been bonded to each other into a plurality of individualized resonator units formed in the wafer.

The plurality of resonator units formed in the wafer into which the first wafer W1a, the second wafer W2a, and the third wafer W3a have been bonded to each other are cut or folded and broken along the imaginary lines L shown in FIG. 18 into individualized resonator units.

In other words, step S85 is the step of cutting or folding and breaking the first wafer W1a, the second wafer W2a, and the third wafer W3a bonded to each other in step S84 into individualized resonator units.

A well-known method can be used to produce individualized resonator units by cutting or folding and breaking the wafer into which the first wafer W1a, the second wafer W2a, and the third wafer W3a have been bonded to each other.

Step S86 is the step of disposing the circuit element 86 at each of the individualized resonator units.

The circuit element 86 is disposed at the upper surface of each of the resonator units, that is, the upper surface of each of the second substrates 83. In detail, the electrode pads VSS, VDD, OUT, OE, XI, and XO, which are disposed at the lower surface of the circuit element 86, are mechanically and electrically coupled via the bonding members 103 to the wiring pattern 101, which is disposed at the upper surface of the second substrate 83.

The resonator devices 5a can thus be manufactured by carrying out steps S81 to S86.

Since steps S81 to S86 allow batch manufacture of the resonator devices 5a, which are components common to the first oscillator 2 and the second oscillator 3, the oscillator group 1 including the first oscillator 2 and the second oscillator 3 can be efficiently manufactured.

Step S1 has been described.

The first oscillator 2 and the second oscillator 3 according to the present embodiment are the same as the first oscillator 2 and the second oscillator 3 according to the first embodiment except that the resonator devices 5a are housed in the first container 8 and the second container 9, as described above. The first oscillator 2 and the second oscillator 3 according to the present embodiment can therefore be manufactured based on the flowchart shown in FIG. 9, as in the first embodiment. Steps S2 to S7 will not therefore be described.

The oscillator manufacturing method according to the present embodiment has been described.

According to the oscillator manufacturing method described above, a plurality of types of oscillators including the first oscillator 2 and the second oscillator 3 can be manufactured by housing the resonator devices 5a of the same type in the first container 8 and the second container 9, respectively, which are containers of different types. The resonator devices 5a each include the storage circuit 71, and the storage circuit 71 stores the characteristic setting information used to set the characteristics f the oscillation circuit 74. The characteristics of the output from the oscillation circuit 74 can be readily changed by changing the characteristic setting information stored in the storage circuit 71 and used to set the characteristics of the oscillation circuit 74.

A plurality of types of oscillators including different containers and having different characteristics of the output from the oscillators can thus be efficiently manufactured at low cost.

The present embodiment can provide the same effects as those provided by the first embodiment, as described above.

3. Third Embodiment

The oscillator manufacturing method according to a third embodiment will next be described.

The first oscillator 2 and the second oscillator 3 manufactured by the oscillator manufacturing method according to the present embodiment are the same as the first oscillator 2 and the second oscillator 3 according to the first embodiment except that the resonator devices 5 are replaced with resonator devices 5b.

The resonator devices 5b according to the present embodiment are the same as the resonator devices 5 except that the circuit element 54 is replaced with a circuit element 54b. That is, the first oscillator 2 and the second oscillator 3 manufactured by the oscillator manufacturing method according to the present embodiment are the same as those in the first embodiment except that the circuit element 54 is replaced with the circuit element 54b.

The circuit element 54b according to the present embodiment is the same as the circuit element 54 according to the first embodiment except that the circuit element 54b does not include the PLL circuit 77 but includes a temperature sensor 111 and a temperature compensation circuit 113, and that temperature correction setting information that sets the temperature correction performed by the temperature compensation circuit 113 is stored in the storage circuit 71 in place of the frequency division ratio DPL of the frequency divider provided in the PLL circuit 77.

The temperature correction setting information, which sets the temperature correction performed by the temperature compensation circuit 113, is information that sets the frequency-temperature characteristic of the oscillation signal generated by the oscillation circuit 74.

That is, the frequency-temperature characteristic of the oscillation signal generated by the oscillation circuit 74 is an example of the characteristics of the output from the oscillation circuit 74. The temperature correction setting information, which sets the temperature correction performed by the temperature compensation circuit 113, is an example of the characteristic setting information used to set the characteristics of the oscillation circuit 74, in detail, characteristic setting information that sets the frequency-temperature characteristic of the oscillation signal generated by the oscillation circuit 74.

In other words, the oscillator manufacturing method according to the present embodiment is the same as the oscillator manufacturing method according to the first embodiment except that step S1 of preparing the resonator device 5b and steps S3 and S6 of setting the characteristic setting information differ from steps S1, S3, and S6 in the first embodiment.

The same configurations as those in the first embodiment described above have the same reference characters and will not be described.

The resonator devices 5b will be described.

The resonator devices 5b are the same as the resonator devices 5 except that the circuit element 54 is replaced with the circuit element 54b, as described above. That is, the resonator devices 5b correspond to a configuration in which the circuit element 54 shown in FIGS. 4 and 11 is replaced with the circuit element 54b.

The circuit element 54b provided in each of the resonator devices 5b is formed at the lower surface of the first substrate 52.

In the present embodiment, the circuit element 54b is disposed at the lower surface of the first substrate 52, but may instead be disposed at the upper surface of the first substrate 52.

The connection electrodes 31, 32, 33, and 34 are disposed at the lower surface of the resonator device 5b. When the resonator device 5b is housed in the first container 8, the connection electrodes 31, 32, 33, and 34 are bonded to the inner electrodes 16, 17, 18, and 19 provided in the first container 8, respectively, via the bonding members 35. When the resonator device 5b is housed in the second container 9, the connection electrodes 31, 32, 33, and 34 are bonded to the inner electrodes 16a, 17a, 18a, and 19a provided in the second container 9, respectively, via the bonding members 35.

The circuit element 54b will next be described with reference to FIG. 19.

Figure 19:
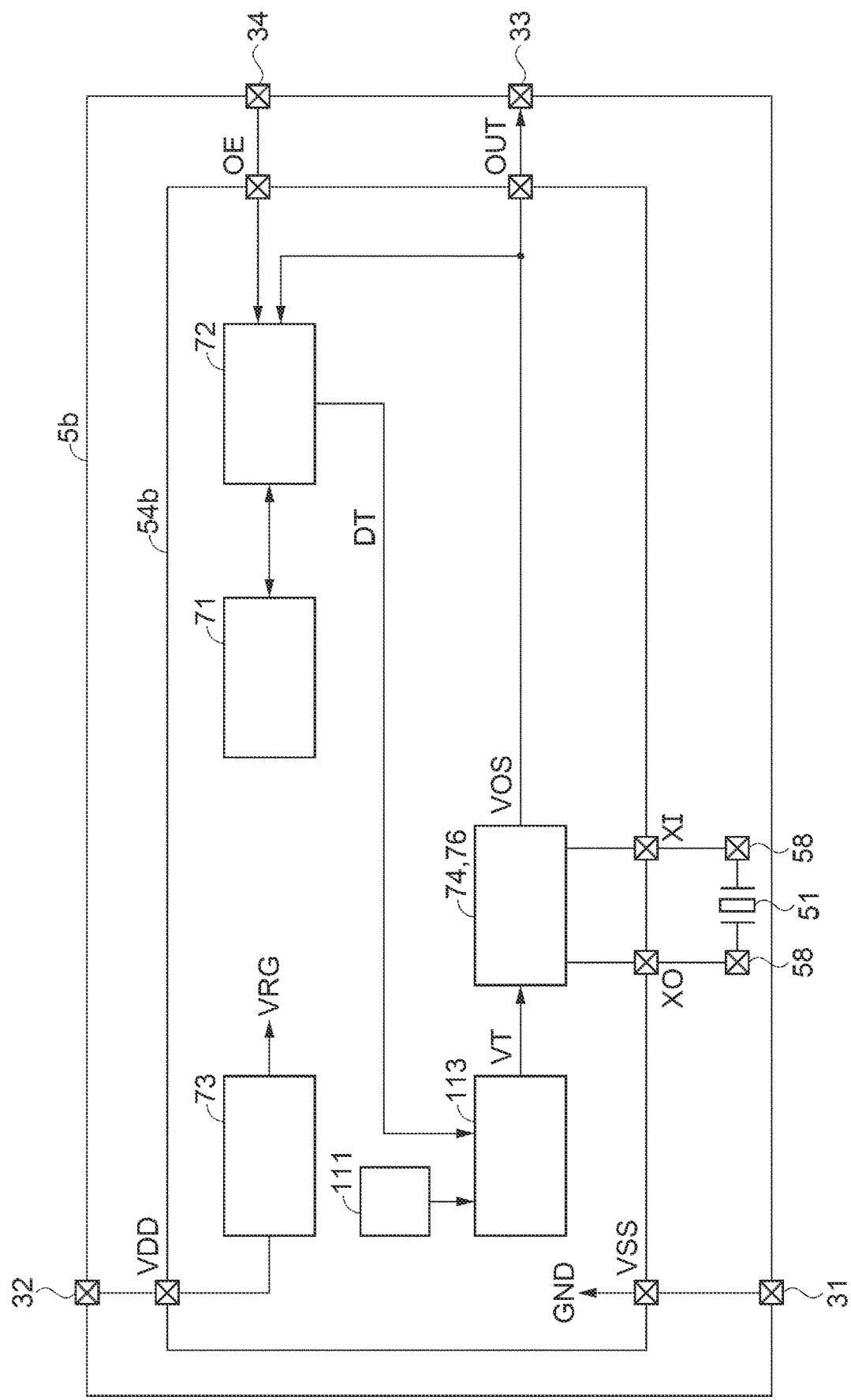
FIG. 19 is a function block diagram of the resonator device according to a third embodiment.

The circuit element 54b includes the storage circuit 71, the logic circuit 72, the bias circuit 73, the oscillation circuit 74, the temperature sensor 111, and the temperature compensation circuit 113, as shown in FIG. 19. The circuit element 54b may instead have a configuration in which some of the elements described above are omitted or changed or a configuration in which other elements are added to the elements described above.

In the present embodiment, the oscillation circuit 74 includes the circuit for oscillation 76. The oscillation signal VOS generated by the circuit for oscillation 76 is the oscillation signal generated by the oscillation circuit 74. In other words, the circuit for oscillation 76 is the oscillation circuit 74.

The storage circuit 71 stores a variety of pieces of information including the characteristic setting information used to set the characteristics of the oscillation circuit 74.

In the present embodiment, the characteristic setting information set in the storage circuit 71 and used to set the characteristics of the oscillation circuit 74 is information that sets the frequency-temperature characteristic of the oscillation signal generated by the oscillation circuit 74. In detail, the characteristic setting information set in the storage circuit 71 and used to set the characteristics of the oscillation circuit 74 is the temperature correction setting information, which sets the temperature correction performed by the temperature compensation circuit 113.

The logic circuit 72 reads from storage circuit 71 the temperature correction setting information, which is stored in the storage circuit 71 and sets the temperature correction performed by the temperature compensation circuit 113, and supplies the temperature compensation circuit 113 with the read temperature correction setting information.

The temperature sensor 111 detects the temperature of the resonator device 5b as the ambient temperature around the resonator 51. The temperature sensor 111 then outputs a temperature signal having a voltage according to the detected temperature and supplies the temperature compensation circuit 113 with the temperature signal.

The temperature compensation circuit 113 corrects the frequency of the oscillation signal generated by the oscillation circuit 74 based on the temperature signal, which is the output from the temperature sensor 111, and the temperature correction setting information, which is stored in the storage circuit 71 and sets the temperature correction performed by the temperature compensation circuit 113. In detail, the temperature compensation circuit 113 generates a temperature correction signal VT based the temperature signal outputted from the temperature sensor 111, and the temperature correction setting information, which is stored in the storage circuit 71 and sets the temperature correction performed by the temperature compensation circuit 113.

The temperature compensation circuit 113 generates the temperature correction signal VT based, for example, on a temperature compensation function. The temperature compensation function is a polynomial into which the temperature is inputted as a variable and which outputs as a variable the temperature correction signal VT, which compensates the frequency-temperature characteristic of the resonator 51. Approximation of the polynomial is performed to any degree. When the temperature compensation function is a higher-degree polynomial, coefficient information DT, which includes constant, linear, quadratic, and higher-order coefficients of the polynomial, is the temperature correction setting information, which sets the temperature correction performed by the temperature compensation circuit 113.

The coefficient information DT on the coefficients of the temperature compensation function, which compensates the frequency-temperature characteristic of the resonator 51, is an example of the characteristic setting information that set the frequency-temperature characteristic of the oscillation circuit 74. The characteristic setting information that sets the frequency-temperature characteristic of the oscillation circuit 74 is not limited to the coefficient information DT on the coefficient of the temperature compensation function.

That is, the storage circuit 71 stores the coefficient information DT on the coefficients of the temperature compensation function, which compensates the frequency-temperature characteristic of the resonator 51, as the temperature correction setting information, which sets the temperature correction performed by the temperature compensation circuit 113. The logic circuit 72 reads from the storage circuit 71 the coefficient information DT on the coefficients of the temperature compensation function, which compensates the frequency-temperature characteristic of the resonator 51, as the temperature correction setting information, which sets the temperature correction performed by the temperature compensation circuit 113, and supplies the temperature compensation circuit 113 with the read coefficient information DT.

The temperature compensation circuit 113 generates the temperature correction signal VT based on the temperature signal, which is outputted from the temperature sensor 111, and the temperature compensation function having the coefficients at the variety of orders set by the coefficient information DT on the coefficients of the temperature compensation function. The temperature correction signal VT is a voltage signal. The temperature correction signal VT is applied to one end of a variable capacitance element that is not shown but is provided in the oscillation circuit 74. The variable capacitance element functions as load capacitance of the oscillation circuit 74. The temperature correction signal VT can therefore control the frequency of the oscillation signal generated by the oscillation circuit 74.

In the present embodiment, the frequency of the oscillation signal generated by the oscillation circuit 74 can thus be corrected based on the temperature signal outputted from the temperature sensor 111, and the temperature correction setting information, which is the characteristic setting information and sets the temperature correction performed by the temperature compensation circuit 113. The frequency of the oscillation signal generated by the oscillation circuit 74 can be corrected so as to be substantially fixed at any temperature that falls within a predetermined temperature range by correcting the frequency of the oscillation signal generated by the oscillation circuit 74 based on the temperature signal outputted from the temperature sensor 111 and the temperature correction setting information, which sets the temperature correction performed by the temperature compensation circuit 113.

The circuit element 54*b* has been described.

The oscillator manufacturing method according to the present embodiment will next be described.

The first oscillator 2 and the second oscillator 3 according to the present embodiment are the same as the first oscillator 2 and the second oscillator 3 according to the first embodiment except that the resonator devices 5*b* each including the circuit element 54*b* in place of the resonator devices 5 each including the circuit element 54 are housed in the first container 8 and the second container 9, as described above. The first oscillator 2 and the second oscillator 3 according to the present embodiment can therefore be manufactured based on the flowchart shown in FIG. 9, as in the first embodiment. In the present embodiment, however, the details of steps S1, S3, and S6 differ from those in the first embodiment in the flowchart shown in FIG. 9.

Steps S1, S3, and S6 will therefore be described with reference to FIGS. 9 and 10.

Step S1 will first be described.

Step S1 is the step of preparing the resonator devices 5*b*.

In the present embodiment, step S1 includes steps S11, S12, S13, S14, S15, and S16, as shown in FIG. 10.

Step S11 is the step of preparing the first wafer W1. A plurality of first substrates 52 are formed across the first wafer W1. The mounting electrodes 58 are disposed at the upper surface of the first wafer W1, that is, the upper surface of each of the first substrates 52. The circuit element 54*b* is disposed at the lower surface of each of the first substrates 52. The connection electrodes 31, 32, 33, and 34 are disposed at the lower surface of the circuit element 54*b*. The pass-through electrodes 62, which electrically couple the mounting electrodes 58 and the circuit element 54*b* to each other, are formed therebetween.

Steps S12 to S16 are the same as those in the first embodiment and will therefore not be described.

The resonator devices 5*b* each including the circuit element 54*b* can thus be manufactured by carrying out steps S11 to S16.

Since steps S11 to S16 allow batch manufacture of the resonator devices 5*b*, which are components common to the first oscillator 2 and the second oscillator 3, the oscillator group 1 including the first oscillator 2 and the second oscillator 3 can be efficiently manufactured.

Step S1 has been described.

Referring back to FIG. 9, step S2 is the same as that in the first embodiment and will therefore not be described, and step S3 and the following steps will be described.

Step S3 is the step of setting the characteristic setting information in the storage circuit 71 provided in each of the resonator devices 5*b*. In detail, in step S3, the characteristic setting information is so set in the storage circuit 71 that the first oscillator 2 has desired output characteristics. In the present embodiment, the characteristic setting information that sets the frequency-temperature characteristic of the first oscillator 2 is set in the storage circuit 71.

In the present embodiment, the characteristic setting information that sets the frequency-temperature characteristic of the first oscillator 2 is information that sets the frequency-temperature characteristic of the oscillation circuit 74 provided in the resonator device 5*b*. In detail, the characteristic setting information that sets the frequency-temperature characteristic of the oscillation circuit 74 is the temperature correction setting information, which sets the temperature correction performed by the temperature compensation circuit 113. In more detail, the characteristic setting information that sets the frequency-temperature characteristic of the oscillation circuit 74 is the coefficient information DT on the coefficients of the temperature compensation function that compensates the frequency-temperature characteristic of the resonator 51. That is, in the present embodiment, the characteristic setting information set in the storage circuit 71 is the temperature correction setting information, which sets the temperature correction performed by the temperature compensation circuit 113. In detail, the characteristic setting information set in the storage circuit 71 is the coefficient information DT on the coefficients of the temperature compensation function that compensates the frequency-temperature characteristic of the resonator 51.

In the present embodiment, in step S3, the connection electrodes 33 and 34 of the resonator device 5*b* are electrically coupled to an external apparatus that is not shown.

The logic circuit 72 provided in the circuit element 54*b* performs data communication with the external apparatus and causes the storage circuit 71 to store the characteristic setting information transmitted from the external apparatus. When the characteristic setting information is stored in the storage circuit 71, the characteristic setting information is set in the storage circuit 71.

Step S3 has been described.

Steps S4 and S5 are the same as those in the first embodiment and will therefore not be described, and step S6 and the following steps will be described.

Step S6 is the step of setting the characteristic setting information in the storage circuit 71 provided in the resonator device 5*b*. In detail, in step S6, the characteristic setting information is so set in the storage circuit 71 that the second oscillator 3 has desired output characteristics. In the present embodiment, the characteristic setting information that sets the frequency-temperature characteristic of the second oscillator 3 is set in the storage circuit 71.

The characteristic setting information set in the storage circuit 71 in step S6 and the characteristic setting information stored in the storage circuit 71 in step S3 may be the same or differ from each other. That is, the characteristic setting information stored in the storage circuit 71 of the resonator device 5*b* provided in the second oscillator 3 and the characteristic setting information stored in the storage circuit 71 of the resonator device 5*b* provided in the first oscillator 2 may be the same or may differ from each other. In the present embodiment, the frequency-temperature characteristic of the oscillation signal generated by the oscillation circuit 74 in the resonator device 5*b* provided in the second oscillator 3 and the frequency-temperature characteristic of the oscillation signal generated by the oscillation circuit 74 in the resonator device 5b provided in the first oscillator 2 can be different from each other by causing the coefficient information DT on the coefficients of the temperature compensation function stored in the storage circuit 71 in the second oscillator 3 and the coefficient information DT on the coefficients of the temperature compensation function stored in the storage circuit 71 in the first oscillator 2 to differ from each other.

Step S6 is the same as step S3 but differs therefrom in that the characteristic setting information is so set in the storage circuit 71 that the second oscillator 3 has desired output characteristics. Step S6 will therefore not be described in detail.

Step S7 is the same as that in the first embodiment and will therefore not be described.

When step S7 is completed, the manufacture of the oscillators is completed.

The temperature correction setting information, which sets the temperature correction performed by the temperature compensation circuit 113 and which is the characteristic setting information set in the storage circuit 71, can be calculated through measurement of the frequency-temperature characteristic of the oscillation signal generated by the resonator 51 and calculation based on the result of the measurement. For example, in the present embodiment, the frequency-temperature characteristic of the oscillation signal generated by the resonator 51 is measured, the temperature compensation function is calculated based on the result of the measurement, and the coefficient information DT on the coefficients of the temperature compensation function is used as the temperature correction setting information, which sets the temperature correction performed by the temperature compensation circuit 113.

In the present embodiment, the frequency-temperature characteristic of the oscillation signal generated by the resonator 51 is measured after step S15 shown in FIG. 10 is completed. When step S15 is completed, a plurality of resonator devices 5b are formed in the wafer into which the first wafer W1 and the second wafer W2 are bonded to each other, whereby the frequency-temperature characteristic of the plurality of resonator devices 5b can be measured in a batch process on a wafer basis. In the present embodiment, the frequency-temperature characteristics of the plurality of resonator devices 5b formed in the same wafer and information on the positions of the resonator device 5b in the wafer are so tabulated into a database that the frequency-temperature characteristics and the position information correspond to each other. The temperature correction setting information, which sets the temperature correction performed by the temperature compensation circuit 113, can be set by referring to the database.

The frequency-temperature characteristics of the oscillation signals generated by the resonators 51 are not necessarily measured when step S15 is completed, and may instead be measured, for example, after step S16 is completed, that is, after the individualized resonator devices 5b are formed.

The oscillator manufacturing method according to the present embodiment has been described.

According to the oscillator manufacturing method described above, a plurality of types of oscillators including the first oscillator 2 and the second oscillator 3 can be manufactured by housing the resonator devices 5b of the same type in the first container 8 and the second container 9, respectively, which are containers of different types. The resonator devices 5b each include the storage circuit 71, and the storage circuit 71 stores the characteristic setting information used to set the characteristics of the oscillation circuit 74. The characteristics of the output from the oscillation circuit 74 can be readily changed by changing the characteristic setting information stored in the storage circuit 71 and used to set the characteristics of the oscillation circuit 74.

A plurality of types of oscillators including different containers and having different characteristics of the output from the oscillators can thus be efficiently manufactured at low cost.

The present embodiment can provide the same effects as those provided by the first embodiment, as described above.

The configurations of the first oscillator 2 and the second oscillator 3 and the method for manufacturing the same are not limited to the configurations and the manufacturing method described above, and a variety of variations are conceivable within the scope of the substance of the present disclosure.

For example, in the present embodiment, the temperature signal outputted from temperature sensor 111, which is provided in the circuit element 54b, is supplied to the temperature compensation circuit 113, but the temperature signal supplied to the temperature compensation circuit 113 is not limited to the temperature signal outputted from the temperature sensor 111. For example, the temperature compensation circuit 113 may correct the frequency of the oscillation signal generated by the oscillation circuit 74 based on the temperature signal outputted from a temperature sensor disposed external to the circuit element 54b, and the temperature correction setting information, which sets the temperature correction performed by the temperature compensation circuit 113 and which is the characteristic setting information.

Still instead, for example, in addition to the circuit for oscillation 76, the oscillation circuit 74 may be provided, for example, with a PLL circuit or a direct synthesizer circuit as a circuit that corrects the frequency of the oscillation signal VOS generated by the circuit for oscillation 76. When a PLL circuit or a direct synthesizer circuit is provided, the temperature compensation circuit 113 may supply the PLL circuit or the direct synthesizer circuit with a temperature compensation signal. In this case, for example, when the circuit that corrects the frequency of the oscillation signal VOS generated by the circuit for oscillation 76 is a PLL circuit, the temperature correction signal is the frequency division ratio of the frequency divider provided in the PLL circuit.

4. Fourth Embodiment

The oscillator manufacturing method according to a fourth embodiment will next be described.

The first oscillator 2 and the second oscillator 3 manufactured by the oscillator manufacturing method according to the present embodiment are the same as the first oscillator 2 and the second oscillator 3 according to the first embodiment except that the first container 8 is replaced with the first container 8d and the second container 9 is replaced with the second container 9d, as described above.

In other words, the oscillator manufacturing method according to the present embodiment is the same as the oscillator manufacturing method according to the first embodiment except that the step S4 of housing the resonator device 5 in the first container 8d and step S7 of housing the resonator device 5 in the second container 9d differ from steps S4 and S7 in the first embodiment.

The same configurations as those in the first embodiment described above have the same reference characters and will not be described.

The first oscillator 2 will be described with reference to FIG. 20.

Figure 20:
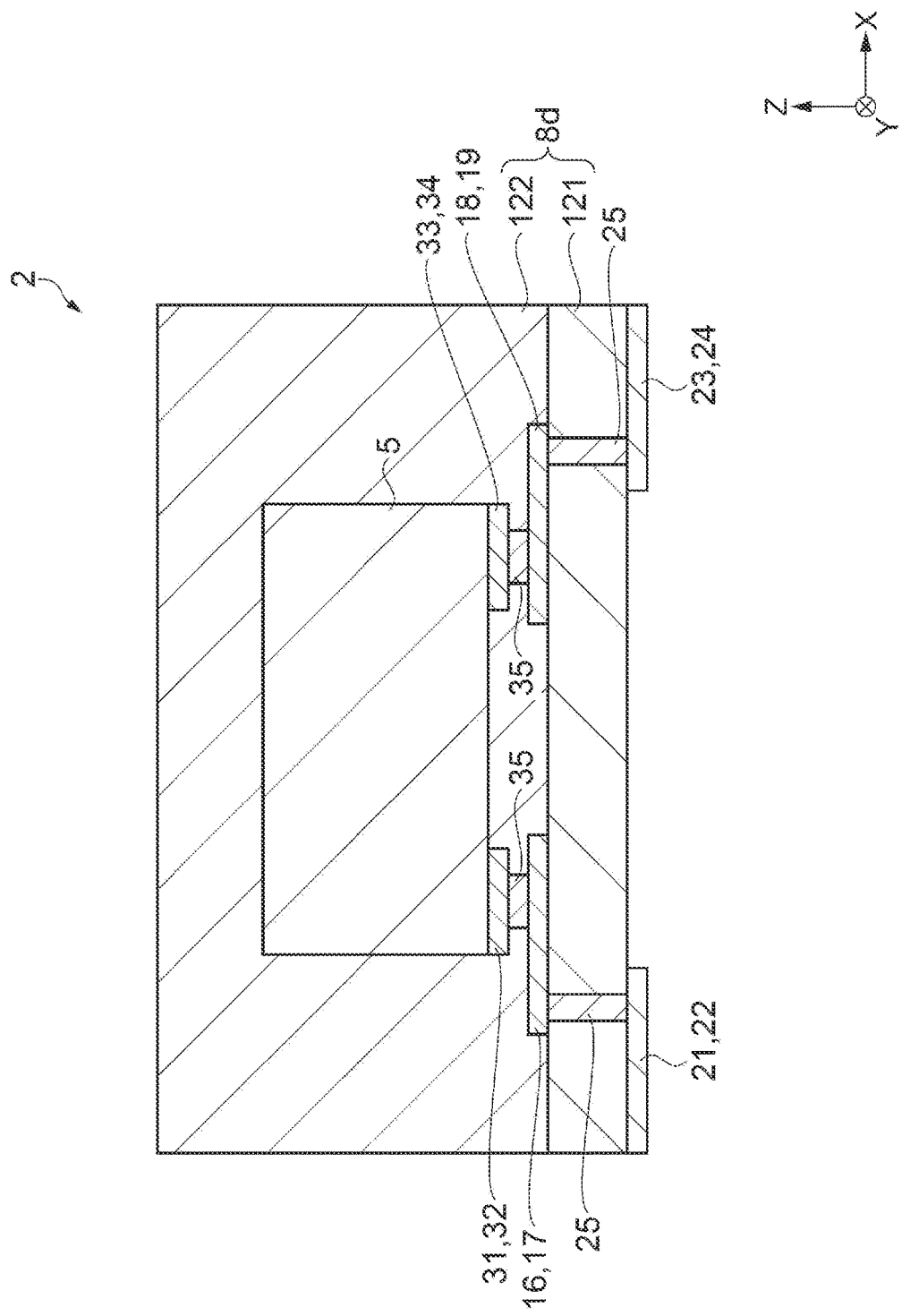
FIG. 20 is a cross-sectional view of the first oscillator according to a fourth embodiment.

The first oscillator 2 includes the resonator device 5 and the first container 8*d*, which houses the resonator device 5, as shown in FIG. 20.

The first container 8*d* includes a container body 121 and a molded section 122.

The resonator device 5 is disposed at the upper surface of the container body 121.

The molded section 122 is further disposed at the upper surface of the container body 121. The molded section 122 coats the resonator device 5.

The first container 8*d* will next be described with reference to FIGS. 20 and 21.

The container body 121 is a flat-plate-shaped container body, as shown in FIGS. 20 and 21. The container body 121 has a rectangular shape in the plan view.

In the present embodiment, the container body 121 is a ceramic substrate. It is, however, noted that the container body 121 is not limited to a ceramic substrate and may instead, for example, be a semiconductor substrate or a printed circuit board.

The inner electrodes 16, 17, 18, and 19 are disposed at the upper surface of the container body 121. The inner electrodes 16, 17, 18, and 19 are bonded to the connection electrodes 31, 32, 33, and 34 provided in the resonator device 5, respectively via the bonding members 35.

The outer electrodes 21, 22, 23, and 24 are disposed at the lower surface of the container body 121.

The outer electrodes 21, 22, 23, and 24 and the inner electrodes 16, 17, 18, and 19 are electrically coupled to each other, respectively, via the pass-through electrodes 25.

The molded section 122 is disposed at the upper surface of the container body 121. The molded section 122 is formed to coat the resonator device 5 disposed at the upper surface of the container body 121. The resonator device 5 is hermetically encapsulated by the molded section 122. The material of which the molded section 122 is made is not limited to a specific material. The material of which the molded section 122 is made can, for example, be thermosetting resin such as epoxy resin. The molded section 122 can be formed, for example, by using compression molding.

The second oscillator 3 will next be described with reference to FIG. 22.

Figure 22:
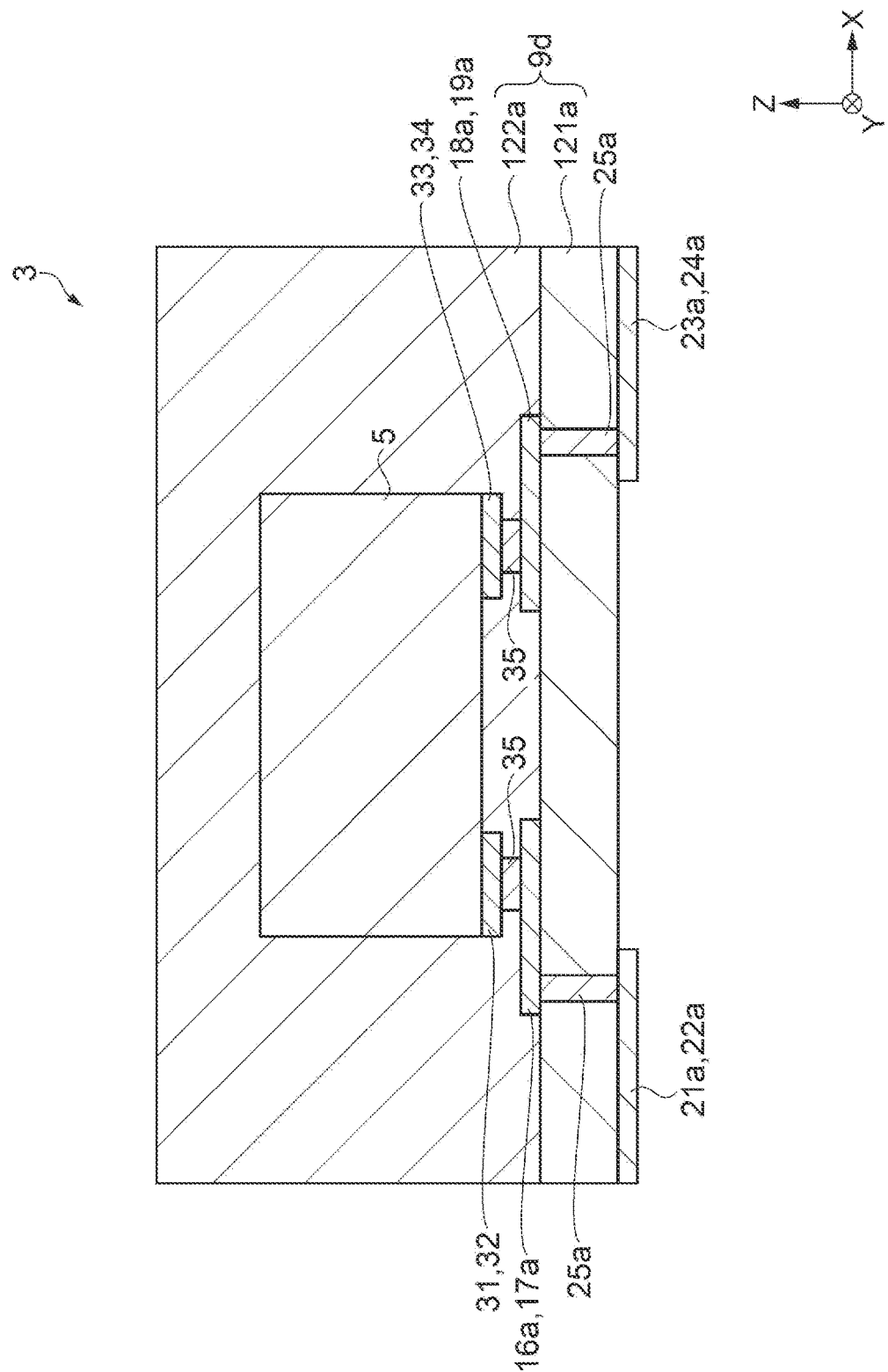
FIG. 22 is a cross-sectional view of the second oscillator according to the fourth embodiment.

The second oscillator 3 includes the resonator device 5 and the second container 9*d*, which houses the resonator device 5, as shown in FIG. 22.

The second container 9*d* includes a container body 121*a* and a molded section 122*a*.

The resonator device 5 is disposed at the upper surface of the container body 121*a*.

The molded section 122*a* is further disposed at the upper surface of the container body 121*a*. The molded section 122*a* coats the resonator device 5.

The second oscillator 3 is the same as the first oscillator 2 but differs therefrom in that the second container 9*d*, which houses the resonator device 5, differs in type from the first container 8*d*.

The second container 9*d* is a container different in type from the first container 8*d*. In the present embodiment, the second container 9*d* differs in shape from the first container 8*d*. In detail, in the plan view, the dimensions of the second container 9*d* in the directions X and Y are greater than the dimensions of the first container 8*d* in the directions X and Y, respectively, and in the side view viewed from the direction X or Y, the dimension of the second container 9*d* in the direction Z is equal to the dimension of the first container 8*d* in the direction Z.

The second container 9*d* will next be described with reference to FIGS. 22 and 23.

The container body 121*a* is a flat-plate-shaped container body, as shown in FIGS. 22 and 23. The container body 121*a* has a rectangular shape in the plan view.

In the present embodiment, the container body 121*a* is a ceramic substrate. It is, however, noted that the container body 121*a* is not limited to a ceramic substrate and may instead, for example, be a semiconductor substrate or a printed circuit board.

The inner electrodes 16*a*, 17*a*, 18*a*, and 19*a* are disposed at the upper surface of the container body 121*a*. The inner electrodes 16*a*, 17*a*, 18*a*, and 19*a* are bonded to the connection electrodes 31, 32, 33, and 34 provided in the resonator device 5, respectively, via the bonding members 35.

The outer electrodes 21*a*, 22*a*, 23*a*, and 24*a* are disposed at the lower surface of the container body 121*a*.

The outer electrodes 21*a*, 22*a*, 23*a*, and 24*a* and the inner electrodes 16*a*, 17*a*, 18*a*, and 19*a* are electrically coupled to each other, respectively, via the pass-through electrodes 25*a*.

The molded section 122*a* is disposed at the upper surface of the container body 121*a*. The molded section 122*a* is formed to coat the resonator device 5 disposed at the upper surface of the container body 121*a*. The resonator device 5 is hermetically encapsulated by the molded section 122*a*. The material of which the molded section 122*a* is made is not limited to a specific material. The material of which the molded section 122*a* is made can, for example, be thermosetting resin such as epoxy resin. The molded section 122*a* can be formed, for example, by using compression molding.

In the present embodiment, the inner electrodes 16, 17, 18, and 19 in the first container 8*d* and the inner electrodes 16*a*, 17*a*, 18*a*, and 19*a* in the second container 9*d* are located at the same positions. The positions where the connection electrodes 31, 32, 33, and 34 and the inner electrodes 16, 17, 18, and 19 in the resonator device 5 are bonded to each other and the positions where the connection electrodes 31, 32, 33, and 34 and the inner electrodes 16*a*, 17*a*, 18*a*, and 19*a* in the other resonator device 5 are bonded to each other are therefore the same, as shown in FIGS. 21 and 23.

The resonator devices 5 of the same type can thus be incorporated in the first container 8*d* and the second container 9*d*, which differ in type from each other, by causing the inner electrodes 16, 17, 18, and 19 in the first container 8*d* and the inner electrodes 16*a*, 17*a*, 18*a*, and 19*a* in the second container 9*d* to be located at the same positions.

In the present embodiment, the inner electrodes 16, 17, 18, and 19 in the first container 8*d* and the inner electrodes 16*a*, 17*a*, 18*a*, and 19*a* in the second container 9*d* have the same dimensions and shape. It is, however, noted that at least one of the dimensions and shape of the inner electrodes 16, 17, 18, and 19 may differ from that of the inner electrodes 16*a*, 17*a*, 18*a*, and 19*a*, as long as the inner electrodes can be coupled to the connection electrodes 31, 32, 33, and 34 in each of the resonator devices 5, respectively.

The inner electrodes 16, 17, 18, and 19 in the first container 8*d* are an example of the "first to N-th inner electrodes", and the inner electrodes 16*a*, 17*a*, 18*a*, and 19*a* in the second container 9*d* are an example of the "(N+1)-th to 2N-th inner electrodes". The connection electrodes 31, 32, 33, and 34 in each of the resonator devices 5 are an example of the "first to N-th connection electrodes". In the present embodiment, the integer N is four.

It is, however, noted that the number of inner electrodes in each of the first container 8d and the second container 9d and the number of connection electrodes in each of the resonator devices 5 are not limited to four. That is, when the integer N is any integer greater than or equal to two, the first container 8d only needs to be provided with the first to N-th inner electrodes, the second container 9d only needs to be provided with the (N+1)-th to 2N-th inner electrodes, and the resonator devices 5 each only need to include the first to N-th connection electrodes.

The first oscillator 2 including the first container 8d and the second oscillator 3 including the second container 9d have been described.

The oscillator manufacturing method according to the present embodiment will next be described.

The first oscillator 2 and the second oscillator 3 according to the present embodiment are the same as the first oscillator 2 and the second oscillator 3 according to the first embodiment except that the first container 8 is replaced with the first container 8d and the second container 9 is replaced with the second container 9d, as described above. The first oscillator 2 and the second oscillator 3 according to the present embodiment can therefore be manufactured based on the flowchart shown in FIG. 9, as in the first embodiment. In the present embodiment, however, the details of steps S4 and S7 differ from those in the first embodiment in the flowchart shown in FIG. 9.

Steps S4 and S7 will therefore be described with reference to FIGS. 9, 12, 13, 20, and 22.

Steps S1 to S3 are the same as those in the first embodiment and will therefore not be described.

Step S4 is the step of housing the resonator device 5 in the first container 8d to manufacture the first oscillator 2.

In the present embodiment, step S4 includes step S41 of disposing the resonator device 5 in the container body 121 of the first container 8d and step S42 of encapsulating the resonator device 5 in the first container 8d, as shown in FIG. 12.

Step S41 is the same as that in the first embodiment and will therefore not be described.

Step S42 is the step of encapsulating the resonator device 5 in the first container 8d.

The molded section 122 is disposed at the upper surface of the container body 121 to coat the resonator device 5, as shown in FIG. 20. The resonator device 5 is thus hermetically encapsulated by the molded section 122.

The first oscillator 2 can thus be manufactured by carrying out steps S41 and S42 to house the resonator device 5 in the first container 8d.

Referring back to FIG. 9, steps S5 and S6 are the same as those in the first embodiment and will therefore not be described, and step S7 and the following steps will be described.

Step S7 is the step of housing the resonator device 5 in the second container 9d to manufacture the second oscillator 3.

In the present embodiment, step S7 includes step S71 of disposing the resonator device 5 in the container body 121a of the second container 9d and step S72 of encapsulating the resonator device 5 in the second container 9d, as shown in FIG. 13.

Step S71 is the same as that in the first embodiment and will therefore not be described.

Step S72 is the step of encapsulating the resonator device 5 in the second container 9d.

The molded section 122a is disposed at the upper surface of the container body 121a to coat the resonator device 5, as shown in FIG. 22. The resonator device 5 is thus hermetically encapsulated by the molded section 122a.

The second oscillator 3 can thus be manufactured by carrying out steps S71 and S72 to house the resonator device 5 in the second container 9d.

Returning back to FIG. 9, when step S7 is completed, the manufacture of the oscillators is completed.

The oscillator manufacturing method according to the present embodiment has been described.

According to the oscillator manufacturing method described above, a plurality of types of oscillators including the first oscillator 2 and the second oscillator 3 can be manufactured by housing the resonator devices 5 of the same type in the first container 8d and the second container 9d, respectively, which are containers of different types. The resonator devices 5 each include the storage circuit 71, and the storage circuit 71 stores the characteristic setting information used to set the characteristics of the oscillation circuit 74. The characteristics of the output from the oscillation circuit 74 can be readily changed by changing the characteristic setting information stored in the storage circuit 71 and used to set the characteristics of the oscillation circuit 74.

A plurality of types of oscillators including different containers and having different characteristics of the output from the oscillators can thus be efficiently manufactured at low cost.

The present embodiment can provide the same effects as those provided by the first embodiment, as described above.

The configurations of the first oscillator 2 and the second oscillator 3 and the method for manufacturing the same are not limited to the configurations and the manufacturing method described above, and a variety of variations are conceivable within the scope of the substance of the present disclosure.

In the present embodiment, the first container 8d includes the molded section 122, and the resonator device 5 housed in the first oscillator 2 is hermetically encapsulated by the molded section 122. Similarly, the second container 9d includes the molded section 122a, and the resonator device 5 housed in the second oscillator 3 is hermetically encapsulated by the molded section 122a.

Neither the resonator device 5 housed in the first container 8d nor the resonator device 5 housed in the second container 9d, however, needs to be hermetically encapsulated by the molded section 122 or 122a. That is, the first container 8d does not need to include the molded section 122, and the second container 9d does not need to include the molded section 122a.

When the first container 8d does not include the molded section 122, the step S42 shown in FIG. 12 is not necessary. When the second container 9d does not include the molded section 122a, the step S72 shown in FIG. 13 is not necessary.

One of the first container 8d and the second container 9d may include the molded section 122 or 122a, and the other of the first container 8d and the second container 9d may not include the molded section 122a or 122. In the configuration described above, the first container 8d and the second container 9d may differ in type from each other by differentiating the shapes of the first container 8d and the second container 9d from each other. In other words, the first container 8d and the second container 9d may differ in type from each other by employing a configuration in which the resonator device 5 housed in one of the first container 8d and the second container 9d is hermetically encapsulated and the resonator device 5 housed in the other of the first container 8d and the second container 9d is not hermetically encapsulated.

The method for manufacturing a plurality of types of oscillators including the first oscillator 2 and the second oscillator 3 has been described based on the first to fourth embodiments. The present disclosure is, however, not limited thereto, and the configuration of each of the portions described above can be replaced with any configuration having the same function. Furthermore, any other constituent element may be added to any of the embodiments of the present disclosure. Moreover, the embodiments may be combined as appropriate with each other.

For example, the first and third embodiments may be combined with each other.

What is claimed is:

1. A method for manufacturing a plurality of types of oscillators including a first oscillator and a second oscillator, the method comprising:
   preparing a first resonator device and a second resonator device each including a resonator, a first substrate, a second substrate so disposed that the first and second substrates sandwich the resonator, an oscillation circuit electrically coupled to the resonator, and a storage circuit that stores characteristic setting information used to set characteristics of the oscillation circuit, the first and second substrates each being a semiconductor substrate, a quartz crystal substrate, a glass substrate, or a resin film substrate;
   housing the first resonator device in a first container to manufacture the first oscillator;
   housing the second resonator device in a second container different in type from the first container to manufacture the second oscillator; and
   setting the characteristic setting information in the storage circuit,
   wherein the first resonator device and the second resonator device are resonator devices of the same type,
   wherein the first container is provided with one or more inner electrodes,
   wherein the second container is provided with three or more inner electrodes,
   wherein the first and second resonator devices each include one or more connection electrodes,
   wherein each inner electrode in the first container is in a first position and each inner electrode in the second container is located in a second position corresponding to the first position,
   wherein manufacturing the first oscillator includes coupling each connection electrode to a corresponding inner electrodes, and
   wherein manufacturing the second oscillator includes coupling each connection electrode to a corresponding inner electrode.

2. A method for manufacturing a plurality of types of oscillators including a first oscillator and a second oscillator, the method comprising:
   preparing a first resonator device and a second resonator device each including a resonator, a first substrate, a second substrate so disposed that the first and second substrates sandwich the resonator, an oscillation circuit electrically coupled to the resonator, and a storage circuit that stores characteristic setting information used to set characteristics of the oscillation circuit, the first and second substrates each being a semiconductor substrate, a quartz crystal substrate, a glass substrate, or a resin film substrate;
   housing the first resonator device in a first container to manufacture the first oscillator;
   housing the second resonator device in a second container different in type from the first container to manufacture the second oscillator; and
   setting the characteristic setting information in the storage circuit,
   wherein the first resonator device and the second resonator device are resonator devices of the same type,
   wherein preparing the first and second resonator devices includes
   bonding a first wafer that defines the first substrate and a second wafer that defines the second substrate to each other with the resonator disposed in each of a plurality of cavities formed between the first wafer and the second wafer, and
   cutting, or folding and breaking the first wafer and the second wafer bonded to each other to manufacture a plurality of individualized resonator devices, and
   the first and second wafers are each a semiconductor substrate, a quartz crystal substrate, or a glass substrate.

3. A method for manufacturing a plurality of types of oscillators including a first oscillator and a second oscillator, the method comprising:
   preparing a first resonator device and a second resonator device each including a resonator, a first substrate, a second substrate so disposed that the first and second substrates sandwich the resonator, an oscillation circuit electrically coupled to the resonator, and a storage circuit that stores characteristic setting information used to set characteristics of the oscillation circuit, the first and second substrates each being a semiconductor substrate, a quartz crystal substrate, a glass substrate, or a resin film substrate;
   housing the first resonator device in a first container to manufacture the first oscillator;
   housing the second resonator device in a second container different in type from the first container to manufacture the second oscillator; and
   setting the characteristic setting information in the storage circuit,
   wherein the first resonator device and the second resonator device are resonator devices of the same type,
   wherein the first and second resonator devices each include a third substrate disposed between the first substrate and the second substrate and including the resonator and a frame that surrounds the resonator,
   preparing the first and second resonator devices includes
   forming a plurality of the resonators and a plurality of the frames across a third wafer that defines the third substrate,
   bonding a first wafer to one side of the frames and bonding a second wafer to another side of the frames, and
   cutting, or folding and breaking the first wafer, the second wafer, and the third wafer bonded to each other to manufacture a plurality of individualized resonator devices,
   the first and second wafers are each a semiconductor substrate, a quartz crystal substrate, a glass substrate, or a resin film substrate.

4. The oscillator manufacturing method according to claim 1,
   wherein setting the characteristic setting information in the storage circuit includes setting the characteristic setting information that sets an output frequency of the oscillation circuit.

5. The oscillator manufacturing method according to claim 1,
- wherein the first and second resonator devices each include a temperature sensor and a temperature compensation circuit that corrects an output frequency of the oscillation circuit based on an output from the temperature sensor and temperature correction setting information, and
- setting the characteristic setting information in the storage circuit includes setting the characteristic setting information that sets the temperature correction setting information, which sets the temperature correction performed by the temperature compensation circuit.

6. The oscillator manufacturing method according to claim 2,
- wherein setting the characteristic setting information in the storage circuit includes setting the characteristic setting information that sets an output frequency of the oscillation circuit.

7. The oscillator manufacturing method according to claim 2,
- wherein the first and second resonator devices each include a temperature sensor and a temperature compensation circuit that corrects an output frequency of the oscillation circuit based on an output from the temperature sensor and temperature correction setting information, and
- setting the characteristic setting information in the storage circuit includes setting the characteristic setting information that sets the temperature correction setting information, which sets the temperature correction performed by the temperature compensation circuit.

8. The oscillator manufacturing method according to claim 3,
- wherein setting the characteristic setting information in the storage circuit includes setting the characteristic setting information that sets an output frequency of the oscillation circuit.

9. The oscillator manufacturing method according to claim 3,
- wherein the first and second resonator devices each include a temperature sensor and a temperature compensation circuit that corrects an output frequency of the oscillation circuit based on an output from the temperature sensor and temperature correction setting information, and
- setting the characteristic setting information in the storage circuit includes setting the characteristic setting information that sets the temperature correction setting information, which sets the temperature correction performed by the temperature compensation circuit.

* * * * *